United States Patent [19]
deDood

[11] Patent Number: 5,764,533
[45] Date of Patent: Jun. 9, 1998

[54] APPARATUS AND METHODS FOR GENERATING CELL LAYOUTS

[75] Inventor: Paul C. deDood, Fremont, Calif.

[73] Assignee: Sun MicroSystems, Inc., Palo Alto, Calif.

[21] Appl. No.: 509,868

[22] Filed: Aug. 1, 1995

[51] Int. Cl.$^6$ .................................................. G06F 15/00
[52] U.S. Cl. ........................ 364/491; 257/204; 257/206; 364/488; 364/489; 364/490
[58] Field of Search ........................ 364/488–491; 257/371, 204, 206, 207, 210, 211

[56] References Cited

U.S. PATENT DOCUMENTS

| | | | |
|---|---|---|---|
| 4,928,160 | 5/1990 | Crafts | 257/206 |
| 5,313,079 | 5/1994 | Brasen et al. | 257/206 |
| 5,343,058 | 8/1994 | Shiffer, II | 257/204 |
| 5,348,902 | 9/1994 | Shimada et al. | 437/51 |
| 5,420,447 | 5/1995 | Waggoner | 257/206 |

OTHER PUBLICATIONS

Xia et al. "Optimization–Based Placement Algorithm for BIOMOS Leaf Cell Generation," IEEE, 1994, pp. 1227–1237.

Primary Examiner—Emanuel Todd Voeltz
Assistant Examiner—Vuthe Siek
Attorney, Agent, or Firm—Beyer & Weaver, LLP.

[57] ABSTRACT

An apparatus for generating a cell layout representative of a CMOS logic cell. The apparatus includes a pMOS transistor layout generator for generating a first set of layout data representative of a plurality of substantially similar pMOS relatively low strength transistor groups that are oriented along a first direction. The apparatus further includes an nMOS transistor layout generator for generating a second set of layout data representative of a plurality of substantially similar nMOS relatively low strength transistor groups that are also oriented along the first direction. The apparatus further includes a polysilicon conductor generator for generating a third set of layout data representative of a plurality of polysilicon conductors, which are used for coupling transistors in the plurality of substantially similar pMOS relatively low strength transistor groups with complementary ones of transistors in the plurality of substantially similar nMOS relatively low strength transistor groups, to create a plurality of low strength gates. There is further included a metal one conductor generator for generating a fourth set of layout data representative of a first metal one conductor. The first metal one conductor is coupled to the plurality of polysilicon conductors to create a higher strength gate out of the plurality of low strength gates.

14 Claims, 14 Drawing Sheets

APPARATUS AND METHODS FOR GENERATING CELL LAYOUTS

BACKGROUND OF THE INVENTION

The present invention relates to methods and apparatus for generating standard Complimentary Metal Oxide Silicon (CMOS) cell layouts. More specifically, the present invention relates to layout generators that are capable of generating CMOS cell layouts in an efficient and flexible manner.

CMOS technology plays an important role in the design of integrated circuits (ICs). In brief, a CMOS gate comprises two transistor structures, an n-type (nMOS) transistor structure and a p-type (pMOS) transistor structure. Each of the nMOS and pMOS structures is created by depositing layers of conducting, insulating, and other transistor forming materials on a substrate. After a series of processing steps, a typical structure usually consists of layers, such as diffusion, polysilicon, and metal layers, that are separated by insulating layers. A general discussion of CMOS technology and fabrication techniques can be found in *Principles of CMOS VLSI Design: A System Perspective* by Neil Weste and Kamran Eshraghian (Addison-Wesley Publishing Company, 1985), incorporated by reference herein for all purposes.

As ICs become more complex, the task of designing a CMOS IC in silicon requires increasingly sophisticated design tools and methodologies. IC designers constantly search for ways to improve performance, in terms of speed, power, and function, to reduce the size of the die, as well as the design time. A popular design method involves the use of standard cells to reduce the complexity of the IC design task. The use of standard cells permits an IC designer to break a complex IC module down into a hierarchy of submodules, thereby simplifying the design task. Each of the submodules, or cells, has a well-defined interface that defines its interaction with other cells. Further, each cell typically comprises a plurality of devices, such as nMOS or pMOS transistors, interconnected using other cell components, such as polysilicon and metal wires, so as to create a discrete unit with a predefined layout and logic. Cells are often standardized, in terms of height, interface characteristics, and the like, to ease the task of selecting appropriate cells for use in designing an IC circuit.

In a cell-based design methodology, cells are furnished to IC designers in libraries, each containing a set of cell layouts grouped together in accordance to some criteria, e.g. functionality, number of inputs, drive strength, speed, and the like. A cell layout is essentially a highly detailed description of a cell, typically in a graphical format, from which masks may be generated to create the physical cell. If a cell layout is well designed, it can be used over and over wherever needed in designing the same IC circuit or even different ICs. Given a comprehensive set of standard cell layouts, it is possible to reduce the task of designing any given IC down into essentially the steps of selecting the appropriate cell layouts, placing the cell layouts where needed in the overall IC layout, and routing the cell layouts together. In this manner, all an IC designer has to know is the function and performance characteristics of a cell, along with the interface information of that cell, to make use of the cell layout in designing an IC. The details of how a given cell is actually implemented in silicon become less important in a cell-based design methodology.

A CMOS cell represents a standard cell whose functions are implemented using CMOS technology. Each CMOS device, or cell device, includes a set of device components defining gates, drains, sources, or the like. A cell includes, in addition to the cell devices, certain cell components, e.g. metal lines, well ties, contacts, or the like. Generally speaking, the closer the cell devices and components can be placed together, the faster the cell. For a given fabrication process, however, there are design rule limits on how closely cell devices and components can be placed together. These design rules affect the design of the cells and are specific to a fabrication process. Adherence to design rules are imperative because if, for example, the devices and/or components are placed too closely together, they may be shorted together due to inevitable imperfections in the fabrication process. Design rules also govern the physical dimensions of cell devices and components. As an example, metal lines created in conformity with a particular set of design rules are usually required to have a minimum thickness to reduce breakage due to mechanical or thermal stress.

Advances in fabrication techniques and/or materials frequently result in changes in the design rules. When design rules change cells, or more commonly cell layouts, have to be regenerated in order to take advantage of these advances. In the past, the task of updating a large number of cell layouts represents a significant expenditure of resources in terms of time and expenses. Historically, layout designers create cell layouts by hand. When design rules change, the cell layouts are regenerated from scratch, also by hand. To reduce the amount of time and effort involved in the generation of cell layouts, a prior art method employs computer graphical workstations to assist in the generation of cell layouts. The computer graphical workstations permit layout designers to graphically edit cell layouts on screen using different colors to represent different layers.

Although the use of graphical workstations represents an improvement over the manual method, this method has its disadvantages. Each time design rules change, each cell layout has to be edited on screen to conform the cell layout to the new design rules. In some cases, the effort involved in editing a cell layout to satisfy changes in design rules equal or exceed the effort involved in creating a new cell layout from scratch. If there are a large number of cells involved, a huge amount of resources is still required to keep the cell libraries abreast advances in fabrication techniques and materials.

Another prior art method involves the use of symbolic layouts. Symbolic layouts are abstract versions of cell layouts. Although symbolic layouts contain information regarding the cell layers, there is no size information associated with the devices or their components. To generate a cell layout, a layout designer inputs the design rules and the relative locations of the devices into a computer. The computer then determines the size of the devices and the components based on the design rules values. Using the inputted relative location information and a symbolic layout, the computer then produces a final cell layout.

Although the use of symbolic layouts reduces the amount of effort involved in creating cell layouts, there are also disadvantages. Since the locations of the devices are fixed, relative to one another, it is not possible for the symbolic layout method to make decisions regarding device locations or orientation based on the values of the design rules. For example, it is not possible to specify that if certain components are less than a given distance from the top of the cell, those components should be rotated or moved to another location to reduce cell height. In other words, the use of symbolic layouts inflexibly results in a particular solution for a given set of design rules and relative location data. Because of this inflexibility, it is often the case that cells created in accordance with the symbolic layout method end up being larger than necessary.

Furthermore, prior art methods couple together transistor groups, which are wired in parallel to multiply a cell drive strength, using polysilicon conductors and terminate their cell terminals in polysilicon. Compared to metal, polysilicon is a poor conductor. Consequently, the use of polysilicon conductors and cell terminals increase the cell's power consumption and reduce performance. Furthermore, because the exact locations of the devices and their terminals are not known beforehand, it is often the case that polysilicon cell terminals created in accordance with prior art methods do not align in the final cell layout with grid points on a grid to facilitate access by place-and-route equipment. To facilitate access by place-and-route equipment, prior art methods typically enlarge the polysilicon wires in order to place polysilicon cell terminals at grid points. When polysilicon wires are enlarged, they take up additional space in the polysilicon layer. As a consequence, the cell itself often has to be expanded to avoid design rules violation, resulting in a final cell layout that is unduly large.

What is needed is an improved apparatus and method that is capable of creating CMOS cell layouts in a highly efficient and flexible manner. The method preferably receives a set of user inputs, and optimizes the cell layout by flexibly determining the relative location and orientation of cell devices and/or components based on the values of design rules and the user inputs. Furthermore, the improved method preferably couples transistor groups together using conductors in a metal one layer to improve electrical performance and to reduce cell size. To facilitate access to cell terminals by place-and-route equipment without unduly enlarging cell size, the improved method preferably employs metal one conductors as cell terminals and couples vias, which are at grid points, to metal one cell terminals.

SUMMARY OF THE INVENTION

The invention relates, in one embodiment, to a method for creating a cell layout representative of a CMOS logic cell in a digital computer. The method includes the step of creating a first half dual structure in a first memory of the digital computer. The first half dual structure includes a first transistor group and a second transistor group, the second transistor group being substantially identical to the first transistor group, transistors in the first transistor group and the second transistor group are of a first type and oriented along a first direction.

The method further includes the step of creating a second half dual structure in a second memory of the digital computer. The second half dual structure includes a third transistor group and a fourth transistor group. The fourth transistor group being substantially identical to the third transistor group, transistors in the third transistor group and the fourth transistor group are of a second type complementary to the first type and oriented along the first direction.

Furthermore, the method includes the step of coupling, using a processor in the digital computer, a polysilicon conductor to an input of a first complementary transistor group. The first complementary transistor group includes a selected transistor in the first transistor group and a selected transistor in the third transistor group. The input of the first complementary transistor group is coupled to gates of the selected transistor in the first transistor group and the selected transistor in the third transistor group.

Additionally, there is the step of coupling, using the processor in the digital computer, a polysilicon conductor to an input of a second complementary transistor group. The second complementary transistor group includes a selected transistor in the second transistor group and a selected transistor in the fourth transistor group, and the input of the second complementary transistor group is coupled to gates of the selected transistor in the second transistor group and the selected transistor in the fourth transistor group The method additionally includes the step of coupling, using the processor in the digital computer, a first metal one conductor to the first polysilicon conductor and the second polysilicon conductor to create a logic gate.

In another embodiment, the method includes the step of placing, responsive to an inputted set of predefined conditions, a set of well ties at one of a first location and a second location. The first location is aligned with both the first half dual structure and the second half dual structure along the first direction while the second location being out of alignment with both the first half dual structure and the second half dual structure.

In yet another embodiment, the inputted set of predefined conditions of the inventive method includes a predefined maximum cell height, and the set of well ties is placed at the first location if a height of the CMOS logic cell does not exceed the predefined maximum cell height. On the other hand, if the height of the CMOS logic cell exceeds the predefined maximum cell height, the set of well ties is then placed at the second location.

In yet another embodiment, the invention relates to an apparatus for generating a cell layout representative of a CMOS logic cell. The apparatus includes a pMOS transistor layout generator for generating a first set of layout data representative of a plurality of substantially similar pMOS relatively low strength transistor groups. Transistors in the plurality of substantially similar pMOS relatively low strength transistor groups are oriented along a first direction. The apparatus further includes an nMOS transistor layout generator for generating a second set of layout data representative of a plurality of substantially similar nMOS relatively low strength transistor groups. Transistors in the plurality of nMOS relatively low strength transistor groups are also oriented along the first direction.

The apparatus further includes a polysilicon conductor generator for generating a third set of layout data representative of a plurality of polysilicon conductors, which are used for coupling transistors in the plurality of substantially similar pMOS relatively low strength transistor groups with complementary ones of transistors in the plurality of substantially similar nMOS relatively low strength transistor groups, to create a plurality of low strength gates. There is further included a metal one conductor generator for generating a fourth set of layout data representative of a first metal one conductor. The first metal one conductor is coupled to the plurality of polysilicon conductors to create a higher strength gate out of the plurality of low strength gates.

These and other features of the present invention will be presented in more detain in the following specification of the invention and the figures.

DESCRIPTION OF THE PREFERRED EMBODIMENTS

1. Physical Embodiment

The invention employs various process steps involving data stored in computer systems. These steps are those requiring physical manipulation of physical quantities. Usually, though not necessarily, these quantities take the form of electrical or magnetic signals capable of being stored, transferred, combined, compared, and otherwise manipulated. It is sometimes convenient, principally for reasons of common usage, to refer to these signals as bits, values, elements, variables, characters, data structures, transistors, conductors, vias, metal one, metal two, or the like. It should remembered, however, that all of these and similar terms are to be associated with the appropriate physical quantities and are merely convenient labels applied to these quantities.

Further, the manipulations performed are often referred to in terms, such as coupling, etching, placing, orienting, lengthening, or the like. In any of the operations described herein that form part of the present invention, these operations are machine operations. Useful machines for performing the operations of the present invention include general purpose digital computers or other similar devices. In all cases, there should be borne in mind the distinction between the method of operations in operating a computer and the method of computation itself. The present invention relates to method steps for operating a computer in processing electrical or other physical signals to generate other desired physical signals.

The present invention also relates to an apparatus for performing these operations. This apparatus may be specially constructed for the required purposes, or it may be a general purpose computer selectively activated or reconfigured by a computer program stored in the computer. The processes presented herein are not inherently related to any particular computer or other apparatus. In particular, various general purpose machines may be used with programs written in accordance with the teachings herein, or it may be more convenient to construct a more specialized apparatus to perform the required method steps. The required structure for a variety of these machines will appear from the description given below.

2. Methods and Apparatus of the Present Invention

Figure 1:
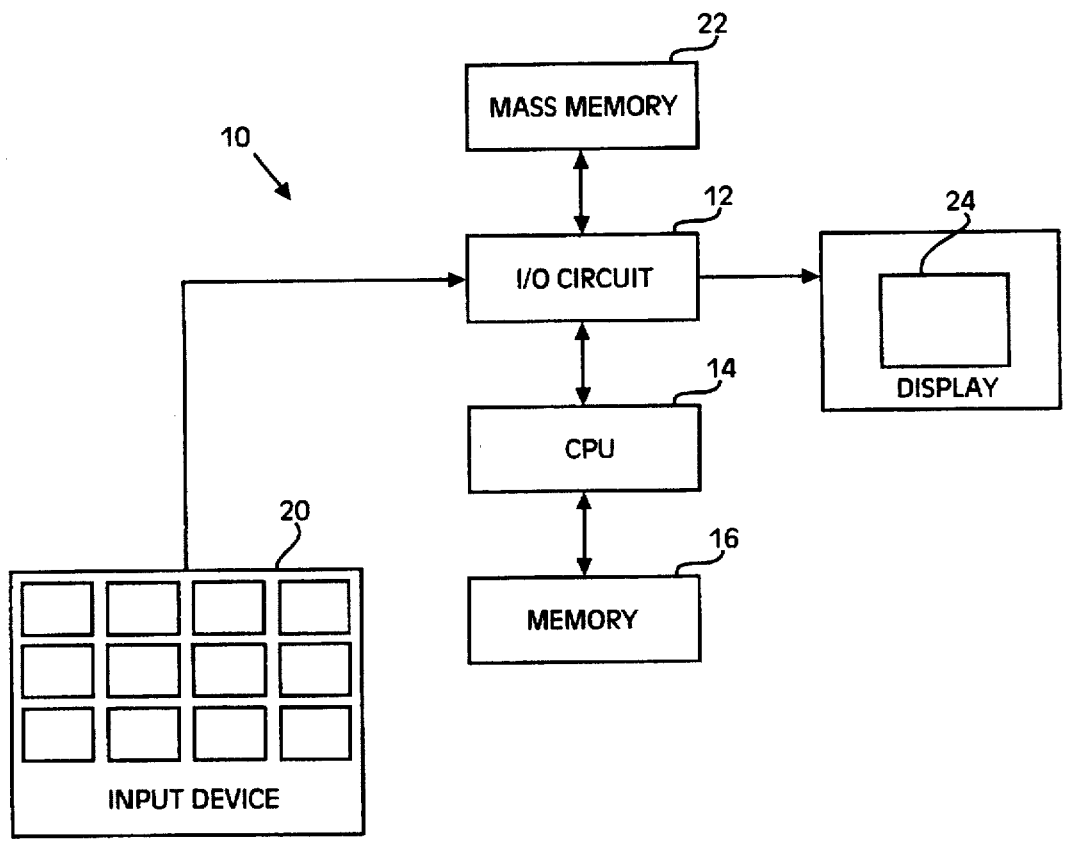
FIG. 1 shows a typical computer-based system according to the present invention.

FIG. 1 shows a typical computer-based system according to the present invention. Shown is a computer 10 which comprises an input/output circuit 12 used to communicate information in appropriately structured form to and from the parts of computer 10 and associated equipment, a central processing unit (CPU) 14, and a memory 16. CPU 14 may represent, for example, a SPARC chip available from Sun Microsystems, Inc., Mountain View, Calif. These components are those typically found in most general and special purpose computers 10 and are intended to be representative of this broad category of data processors.

FIG. 1 also illustrates an input device 20 shown as a keyboard. It should be understood, however, that the input device 20 may actually be a transducer card reader, a magnetic or paper tape reader, a tablet and stylus, a voice or handwriting recognizer, or some other well-known input device such as, of course, another computer. A mass memory device 22 is coupled to the input/output circuit 12 and provides additional storage capability for the computer 10. The mass memory device 22 may be used to store programs, data and the like and may take the form of a magnetic or paper tape reader or some other well known device. It will be appreciated that the information retained within the mass memory device 22, may, in appropriate cases, be incorporated in standard fashion into computer 10 as part of the memory 16.

In addition, a display monitor 24 is illustrated which is used to display the images being generated by the present invention. Such a display monitor 24 may take the form of any of several well-known varieties of cathode ray tube displays or some other well known type of display.

As is well known, the memory 16 may store programs which represent a variety of sequences of instructions for execution by the central processing unit 14. For example, the layout generator programs for generating CMOS cell layouts may be stored within the memory 16.

Figure 2:
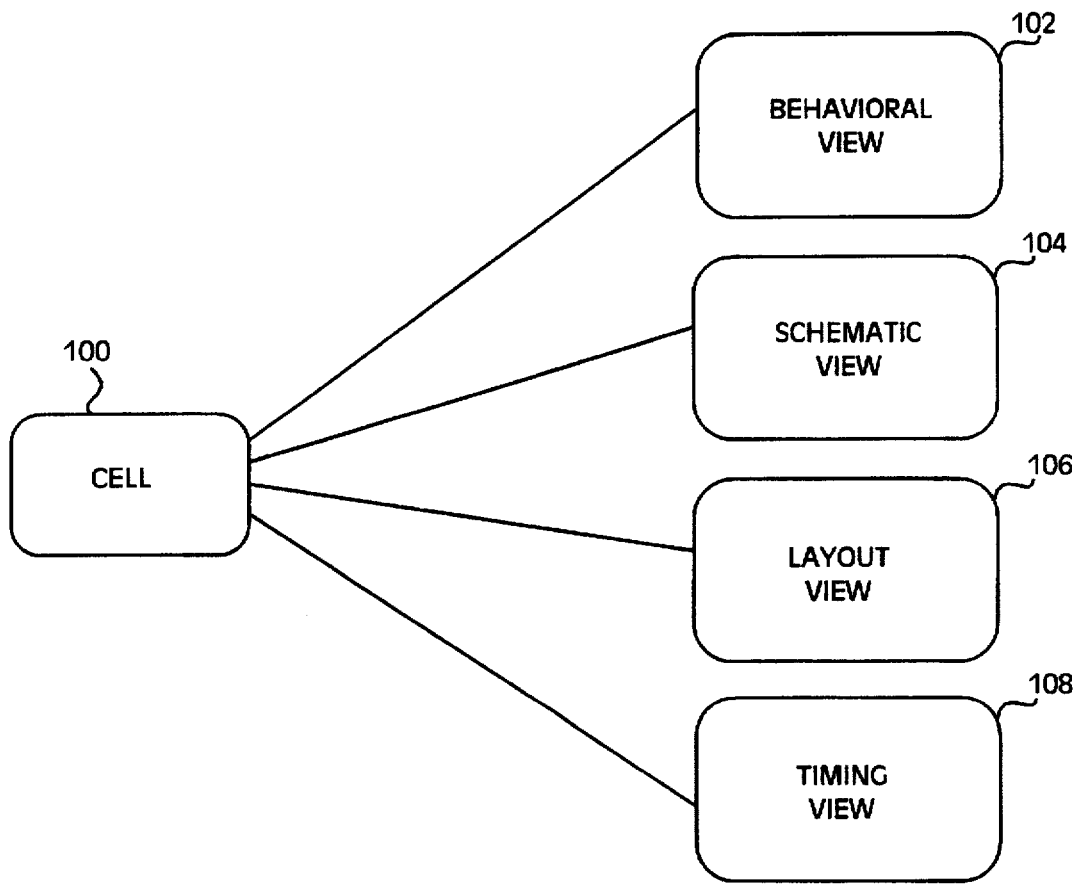
FIG. 2 shows in a representative format the different views that a cell may have.

A cell may have different views, each view representing a different level of abstraction and is relevant to different parts of the IC chip building process. FIG. 2 shows, in a representative format, the different views that a cell may have. Referring now to FIG. 2, a cell 100 may include, among other views, behavioral view 102, schematic view 104, layout view 106, and timing view 108.

Behavioral view 102 represents the high level and conceptual functional description of cell 100. For example, a cell behavioral view may read NOR-2, signifying that the cell implements a 2-input NOR gate.

Schematic view 104 represents a technology-specific, e.g. CMOS, implementation of behavioral view 102. Schematic view 104 includes the cell devices and the interconnections among the cell devices. Schematic view 104 is typically more detailed than behavioral view 102, permitting IC designers to determine certain electrical and performance characteristics of cell 100. Schematic view 104 does not, however, include information regarding the physical locations of the cell devices or cell components or their mask level information.

Layout view 106 typically represents the most detailed view of cell 100. Layout view 106, like schematic view 104, includes the cell devices and their interconnections. Layout view 106, however, also includes information regarding the physical locations of the cell devices and cell components, as well as information regarding their mask levels. Because layout view 106 contains the physical location information, it is used by place-and-route equipment to determine the locations of the terminals of the cell to which conductors are attached for coupling cells to other cells or to other IC components.

Timing view 108 is derived from layout view 106 by analyzing the delays associated with cell devices and cell components. Timing view 108 provides IC designers with information regarding cell performance in the time domain.

Figure 3:
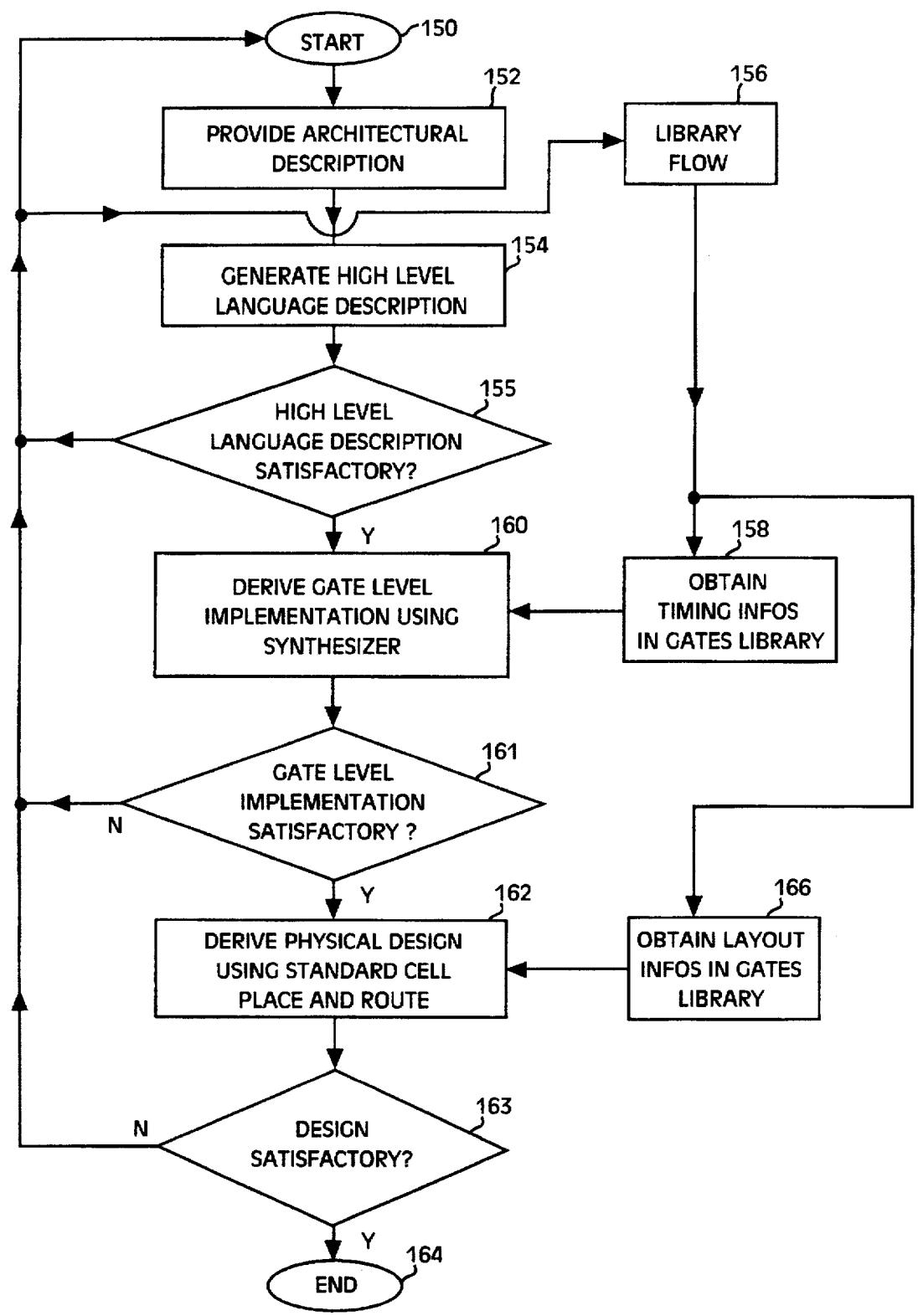
FIG. 3 shows in a simplified flowchart format the major steps involved in designing a typical CMOS IC circuit.

FIG. 3 shows in a simplified flowchart format the major steps involved in designing a typical CMOS IC circuit. FIG. 3 starts at step 150. At step 152, there is provided a set of architectural descriptions of the IC circuit to be designed. If the circuit is intended to be an adder circuit working, in cooperation with a set of registers, for example, the set of architectural descriptions may include the operations required of the adder circuit. In this case, the architectural descriptions may, for example, read: LOAD, ADD, STORE. At the next step 154, there is generated a set of high level design language descriptions of the circuit. For example, the set of high level language descriptions for the aforementioned adder circuit may, for a typical add operation, read: LOAD A, LOAD B, ADD A,B, and STORE C, where A, B, and C are variables. In one embodiment, the high level design language descriptions for an IC are created using the well known software package Verilog by Cadence Design Systems, Inc. of San Jose, Calif.].

The method next proceeds to a decision diamond 155 where the high level language descriptions generated in step 154 are checked. In decision diamond 155, the checking may be performed manually by the user or, preferably, by a software tool which compares the high level descriptions generated in step 154 against a predefined criteria. If the high level language descriptions generated in step 154 prove unsatisfactory, the user can elect to return to step 152 wherein the user can modify the set of provided architectural descriptions.

On the other hand, if the high level descriptions generated in step 154 are satisfactory, the method proceeds to a step 160 to derive the gate level implementation.

In addition to the high level language descriptions generated in step 154, step 160 also takes as an input a set of timing information, which is obtained by a step 158. Step 158 works in cooperation with a library flow step 156, which generates the necessary cells and their various views for use in the IC design process, to obtain the timing information regarding selected cells. The timing information obtained by step 158 is used, in conjunction with the high level language description generated in step 154, to derive the gate level implementation in step 160. In one embodiment, the gate level implementation is derived using a software tool known as Synopsys, manufactured by Synopsys, Inc. of Mountain View, Calif.

Once the gate level implementation is derived in step 160, the method next proceeds to a decision diamond 161 where the gate level implementation derived in step 160 is checked. In decision diamond 161, the checking may be performed manually by the user or, preferably, by a software tool which compares the derived gate level implementation against a set of predefined criteria. If the gate level implementation derived in step 160 proves unsatisfactory, the user can elect to return to one or more of steps 152, 154, 156, and 160. The user can return to step 152 wherein the user can modify the set of provided architectural descriptions, to step 154 and/or 160 to modify variables, or to step 156 wherein a different cell is used for obtaining the timing information in step 158.

On the other hand, if the gate level implementation generated in step 160 is satisfactory, the method proceeds to a step 162 to derive the physical design using standard place-and-route methods. The gate level implementation generated in step 160 is then used, together with the layout information contained in the layout view that is obtained in step 166 to derive the physical design of the chip. Since the layout view contains all necessary physical location information in each cell and the gate level implementation contains the necessary details to interconnect the cells, the task of deriving the physical design in step 162 may be performed using any standard place-and-route methods, including methods utilizing software.

Once the physical design is derived in step 162, the method next proceeds to a decision diamond 163 where the physical design derived in step 162 is checked. In decision diamond 162, checking may be performed manually by the user or, preferably, by a software tool which compares the physical design derived in step 162 against a set of predefined criteria. If the physical design derived in step 162 proves unsatisfactory, the user can elect to return to one or more of steps 152, 154, 156, 160, 162. The user can return to step 152 wherein the user can modify the set of provided architectural descriptions, to step 154 and/or 160 and/or 162 to modify variables, or to step 156 wherein a different cell is used for obtaining the timing information in step 158.

Figure 4:
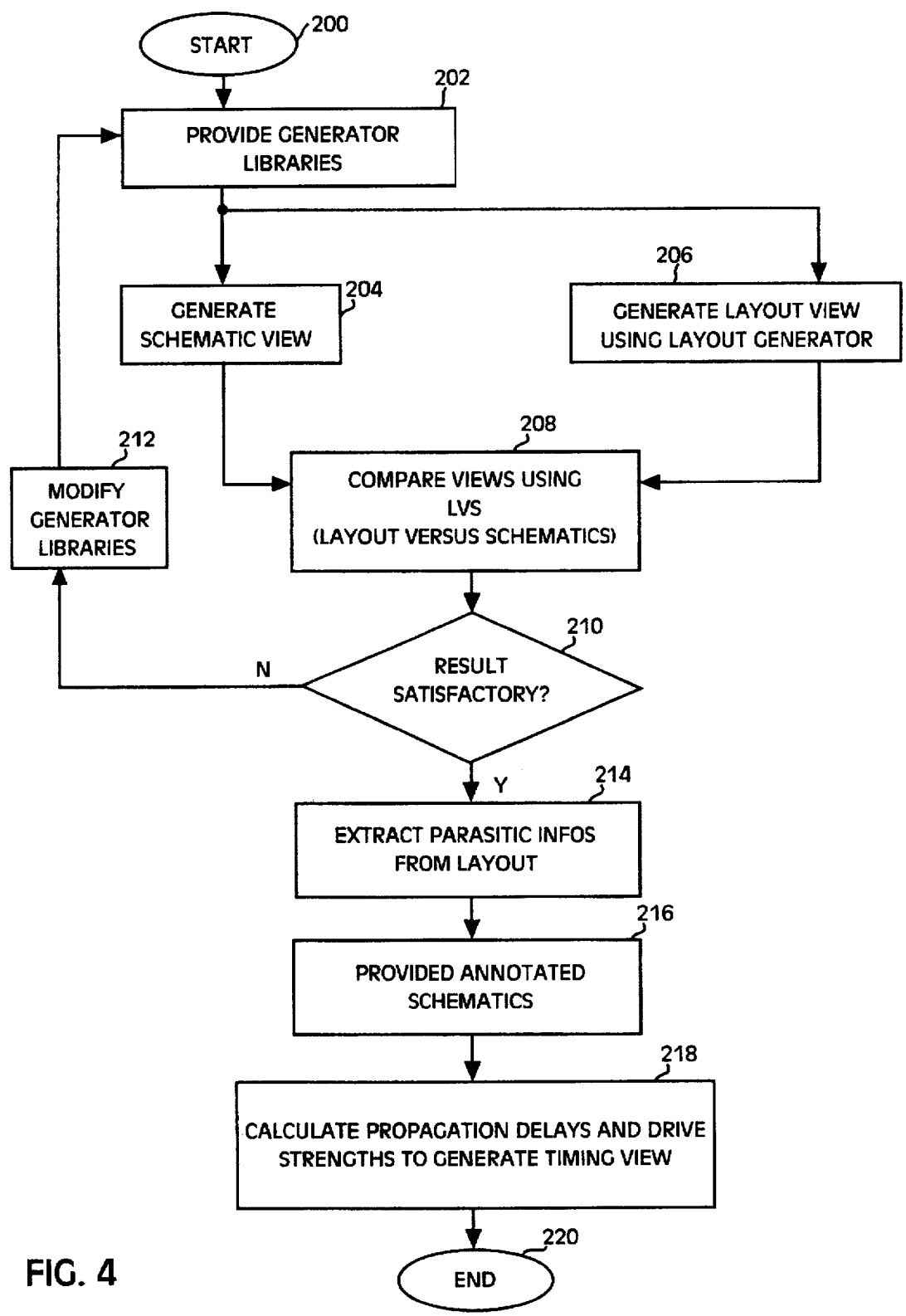
FIG. 4 shows the steps taken by the library flow step of FIG. 3 to derive the various views of a cell.

FIG. 4 shows the steps taken by library flow step 156 of FIG. 3 to derive the various views of a cell. Referring to FIG. 4, shown is a start step 200 where library flow step 156 of FIG. 3 begins. Next, there is shown a step 202 where a library generator is provided. The library generator provided in step 202 is typically a software tool which can generate both the schematic view and the layout view, e.g. schematic view 104 and layout view 108 of FIG. 2. In one embodiment, library generator 202 is created using the Genie programming language by Mentor Graphics Corp. of San Jose, Calif. As seen in FIG. 4, the schematic view and the layout view are generated in steps 204 and 206 respectively.

To ensure accuracy, the schematic view generated in step 204 and the layout view generated in step 206 are compared against each other in step 208. In one embodiment, the comparison is carried out using a process known as LVS (Layout versus Schematic) and using a product known as Checkmate, manufactured by the aforementioned Mentor Graphics Corp. The result of the comparison, which is carried out in step 208, is then passed onto decision diamond 210. If the comparison between the layout view and the schematic view proves unsatisfactory in decision diamond 210, step 212 is invoked to modify the library generator, which is provided in step 202.

On the other hand, if the comparison between the layout view, which is generated in step 206, and the schematic view, which is generated in step 204, is satisfactory, step 214 is next invoked. In step 214, the parasitic information associated with the cell devices and cell components are extracted from the layout view, which is generated in step 206. The parasitic information extracted in step 214 is then combined with the schematic view generated in step 204 to create, in step 216, an annotated schematic. In one embodiment, the aforementioned steps of parasitic information extraction and annotated schematic generation in steps 214 and 216 respectively are performed using the aforementioned Mentor Graphics Checkmate tool.

Next, a timing view is calculated, in step 218, from the layout view, which is generated in step 206. Since the layout view contains all necessary information regarding the cell devices and cell components, as well as information regarding their physical attributes, the timing view can be extracted therefrom using any of the commercially available circuit simulators. After the timing view is extracted in step 218, the library flow steps of FIG. 4 ends in step 220.

Figure 5A:
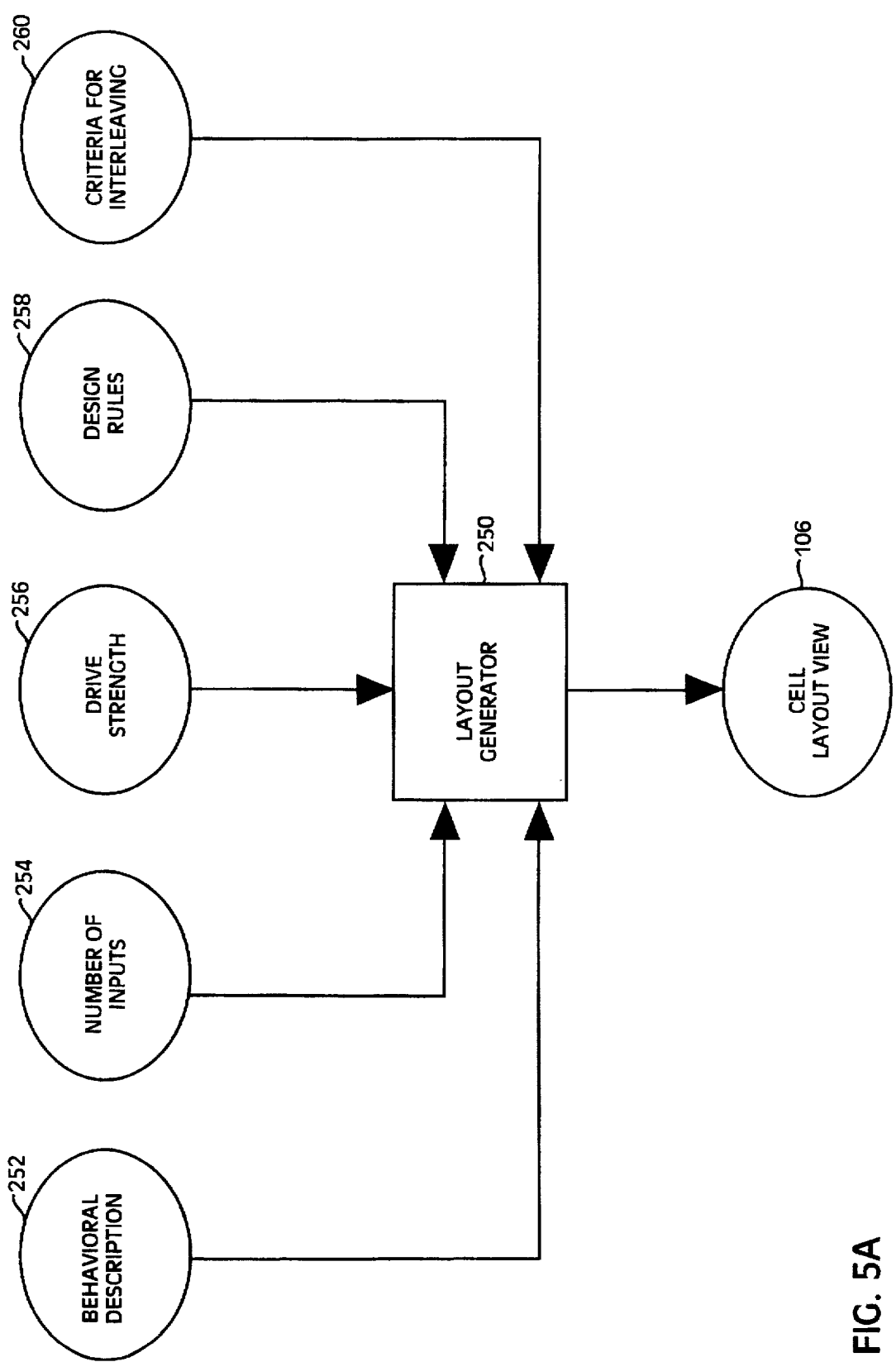
FIG. 5A shows in a simplified format the inputs into a layout generator.

FIG. 5A shows, in a simplified format, the inputs into a layout generator 250. Layout generator 250 is used to generate the layout view in step 206 of FIG. 4. Referring to FIG. 5A, there is shown a layout generator 250 which takes an input a behavioral description 252. Behavioral description 252 represents a set of inputs that specifies the logic functions of the cell to be generated. For example, a behavioral description 252 may read "NAND", signifying that the function of the cell to be generated is a NAND gate. Layout generator 250 also takes as an input the number of inputs 254. The number of inputs 254 represents the number of inputs into the cell to be generated. For example, the number of inputs 254 for a given cell to be generated may read "2." That number of inputs 254 ("2"), in combination with a behavioral description 252 that reads "NAND," results in cell implementing a NAND-2 gate. Behavioral description 252 and number of inputs 254 may be inputted directly by a user into layout generator 250 or obtained from a behavioral view of the cell to be generated.

Another input into layout generator 250 is drive strength 256. Drive strength 256 has a value that directly relates to the amount of current that the cell is expected to source or sink. For example, a cell having a large drive strength is expected to source or sink a larger amount of current than one having a smaller drive strength. Another input into layout generator 250 is a set of design rules 258. Design rules 258 govern how closely devices and components can be placed together and is a function of a specific fabrication process and/or fabrication materials. Layout generator 250 also takes as an input a criteria for interleaving 260. When transistors are interleaved, the cell that results may be smaller than an analogous cell in which transistors are noninterleaved. However, the reduction in size due to interleaving transistors may come with a performance penalty. Depending on the design tradeoffs that an IC designer is willing to make, criteria for interleaving 260 can be entered into layout generator 250 to specify whether the cell to be generated is smaller (interleaved) or faster (noninterleaved).

Inputs 252–260 represent the user inputs into layout generator 250 for creating a specific cell layout. From inputs 252–260, layout generator 250 produces a cell layout 106, which, as discussed in connection with the FIG. 2, includes the cell devices, their interconnections, and information regarding the physical locations of the cell devices and cell components, as well as information regarding their mask levels. Since layout generator 250 is preferably implemented as a computer software program, the task of updating a cell layout to conform to new design rules involves essentially the reexecution of a program implementing layout generator 250 with the new set of design rules as inputs. Similarly, the task of creating a library of cells, all having similar behavioral description (e.g. NOR), involves essentially the repetitive execution of a program implementing layout generator 250 using different combinations of number of inputs 254/drive strength 256 as inputs.

Figure 5B:
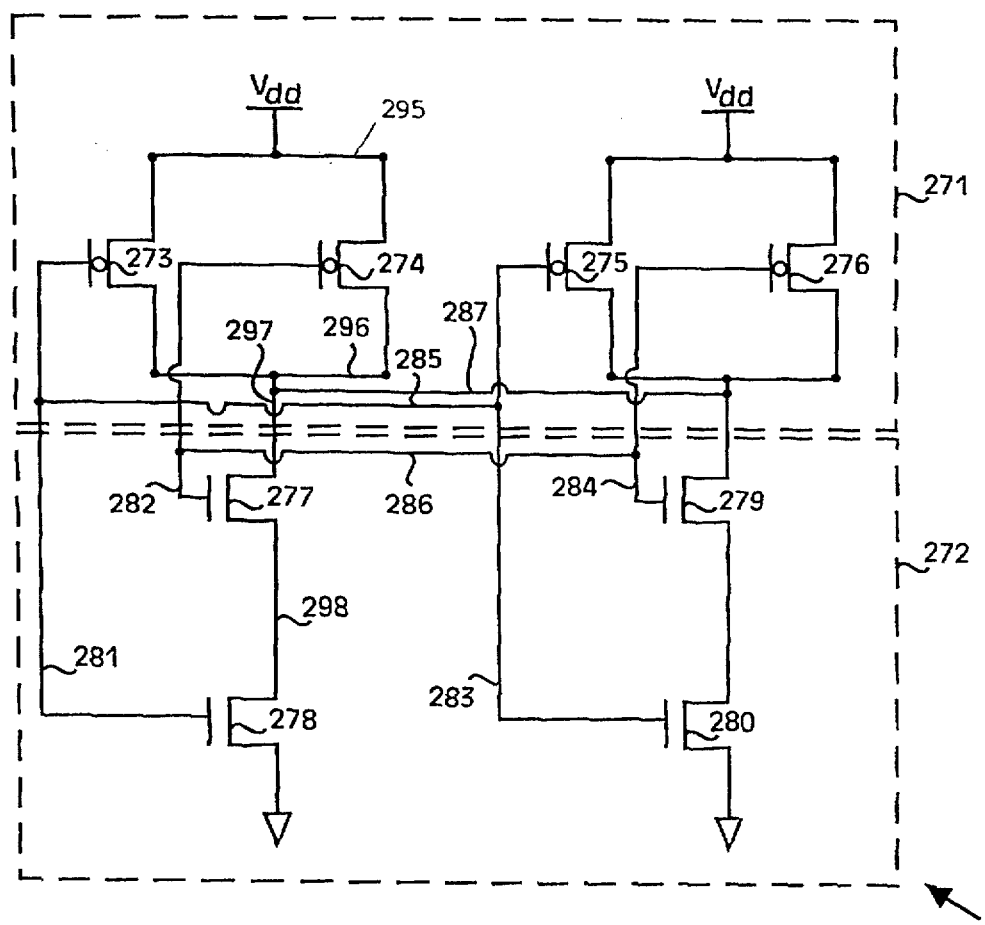
FIG. 5B shows in a simplified circuit format a NAND-2 gate comprising two low strength NAND-2 gates wired in parallel.

FIG. 5B shows in a simplified circuit format a NAND-2 gate comprising two low strength NAND-2 gates wired in parallel. FIG. 5B is used to illustrate the low strength gate concept of the present invention. Referring to FIG. 5B, shown is a CMOS dual structure 270. CMOS dual structure 270 comprises two half dual structures, a pMOS half dual structure 271 and an nMOS half dual structure 272. PMOS half dual structure 271 further comprises a plurality of pMOS low strength transistor groups, e.g. pMOS low strength transistor group 273/274, and pMOS low strength transistor group 275/276. PMOS low strength transistor group 275/276 serves as a supplemental low strength transistor group to pMOS low strength transistor group 273/274. The plurality of pMOS low strength transistor groups 273/274 and 275/276 are wired in parallel, either adjacent one another as shown in FIG. 5B or in an interleaved fashion depending on criteria for interleaving 260, to increase the drive strength of pMOS half dual structure 271.

Similarly, nMOS half dual structure 272 comprises a plurality of nMOS low strength transistor groups, e.g. nMOS low strength transistor group 277/278 and nMOS low strength transistor group 279/280. nMOS low strength transistor group 279/280 serves as a supplemental low strength transistor group to nMOS low strength transistor group 277/278. The plurality of nMOS low strength transistor group 277/278 and 279/280 are wired in parallel, either adjacent one another as shown in FIG. 5B or in an interleaved fashion depending on criteria for interleaving 260, to increase the drive strength of nMOS half dual structure 272.

A pMOS low strength transistor group together with a corresponding nMOS low strength transistor group comprises a low strength complementary transistor group for implementing a gate having a low drive strength, or low strength gate. For example, low strength pMOS transistor group 273/274 together with low strength nMOS transistor group 277/278 comprises a low strength complementary transistor group for implementing a low drive strength NAND-2 gate. Similarly, low strength pMOS transistor group 275/276 together with low strength nMOS transistor group 279/280 comprises a low strength complementary transistor group for implementing another low drive strength NAND-2 gate, which may be thought of as a supplemental low strength complementary transistor group to the low strength complementary transistor group comprising transistors 273, 274, 277, and 278.

When multiple low strength complementary transistor groups are wired in parallel, the CMOS dual structure that is formed implements the same logic function as that implemented by the low strength complementary transistor groups. For example, when the low strength complementary transistor group comprising transistors 273/274 and 277/278 is wired in parallel with the low strength complementary transistor group comprising transistors 275/276 and 279/280, CMOS dual structure 270 is thereby formed and also implements a NAND-2 gate. Due to the contribution of multiple low strength complementary transistor groups wired in parallel, however, the CMOS dual structure that is formed, e.g. CMOS dual structure 270, can advantageously source or sink a substantially greater amount of current than any individual low strength complementary transistor group.

In accordance with the present invention, gates of transistors in a pMOS low strength transistor group are typically coupled to gates of transistors in a corresponding nMOS low strength transistor group using polysilicon wires. For example, gates of transistors 273 and 278 are coupled together by a polysilicon wire 281 in FIG. 5B. Similarly, gates of transistors 274/277, 275/280, and 276/279 are coupled together using polysilicon wires 282, 283, and 284 respectively. These polysilicon wires serve as inputs into the low strength complementary transistor groups. For example, polysilicon wires 281 and 282 serve as two inputs into the NAND-2 gate formed by the low strength complementary transistor group comprising transistors 273, 274, 277, and 278. Similarly, polysilicon wires 283 and 284 serve as two inputs into the NAND 2 gate formed by the low strength complementary transistor group comprising transistors 275, 276, 279, and 280. A metal one conductor, e.g. a conductor 285, is then coupled to one or more polysilicon wires, e.g. polysilicon wires 281 and polysilicon wires 283, to wire the inputs of the low strength complementary transistor groups in parallel. Similarly, polysilicon wires 282 and 284 are coupled together using a metal one conductor 286. As is apparent, metal one conductors 285 and 286 serve as cell input terminals. Another metal one conductor, conductor 287, serves to couple the sources of transistors 273, 274, 275, and 276 with the drains of transistors 277 and 279, effectively coupling the outputs of the low strength complementary transistor groups together to provide a cell output terminal.

Depending on the logic functions that the cell implements, transistors in each low strength transistor groups, e.g. transistors in low strength transistor groups 273/274 or transistors in low strength transistor groups 277/278, are wired either in parallel or in series. For example, transistors 273 and 274 are wired in parallel using metal one conductors 295 and 296, while transistors 277 and 278 are wired in series using metal one conductors 297 and 298, as shown in FIG. 5B, to implement a NAND2 low strength gate. As transistors are built, it is preferable that cell components and device components be aligned with each other. Further, it is preferable that transistors in each group be built as close as possible to one another without violating the design rules. Similarly, it is preferable that transistor groups in each half dual structure be built as close as possible to one another without violating the design rules. In one embodiment, transistors in each half dual structure are built using the ALIGN and ACAP tools that are furnished with the Mentor Graphics Genie tool set.

Figure 5C:
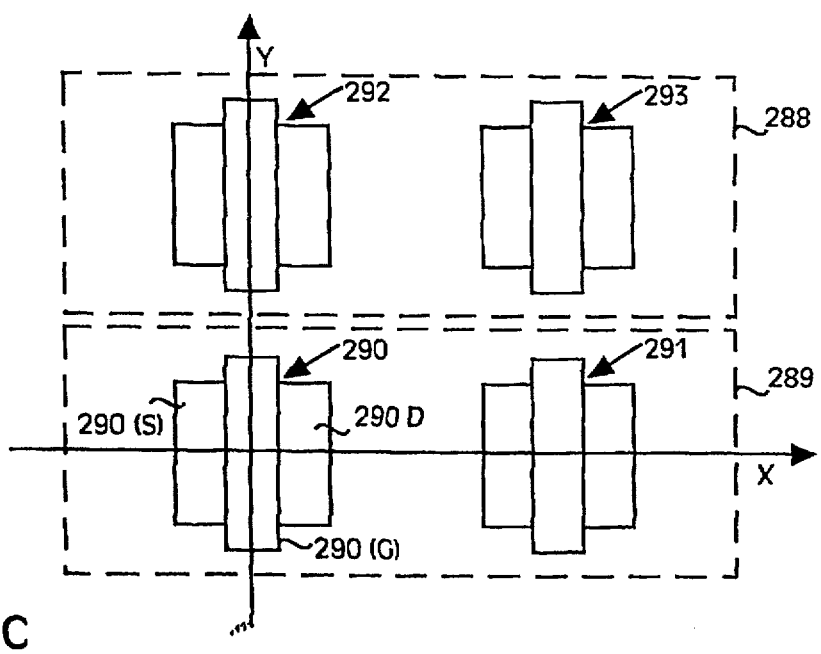
FIG. 5C shows in a simplified format a plurality of transistors, representing transistors in a standard cell, and their orientation.

FIG. 5C shows in a simplified format a plurality of transistors, representing transistors in a standard cell, and their orientation. Referring to FIG. 5C, shown are two half dual structures 288 and 289. There is also shown in half dual structure 289 a transistor 290 which is oriented in the Y direction. A transistor is considered oriented in a given direction when the axis formed by its source, drain, and gate regions is orthogonal to that given direction. Consequently, because an axis formed by source region 290 (S), a gate region 290(G), and a drain region 290(D) of transistor 290, i.e., the X axis, is orthogonal to the Y axis, transistor 290 is considered to be oriented in the Y direction.

As transistors are added to form a complete half dual structure, each additional transistor is preferably placed adjacent to existing transistors in that half dual structure in a direction that is orthogonal to the direction in which the transistors are oriented. In half dual structure 289, additional transistors, e.g. transistor 291, are preferably added during the fabrication process to existing transistor 290 along the X direction as shown.

Additionally, the two half dual structures are preferably oriented along the same direction with which transistors in each group are oriented. In the example of FIG. 5C, half dual structures 288 and 289 are themselves oriented in the Y direction, the same direction in which transistors 290, 291, 292, and 293 are oriented.

It should be noted that FIGS. 5B and 5C are illustrated herein to illustrate the overall concept of multiple low strength transistor groups in half dual structures and their orientation in the preferred embodiment. The directions shown therein, e.g. X, and Y, are relative and are referred as such only for ease of illustration of the orientation of transistors and half dual structures along the orthogonal axes.

Figure 6:
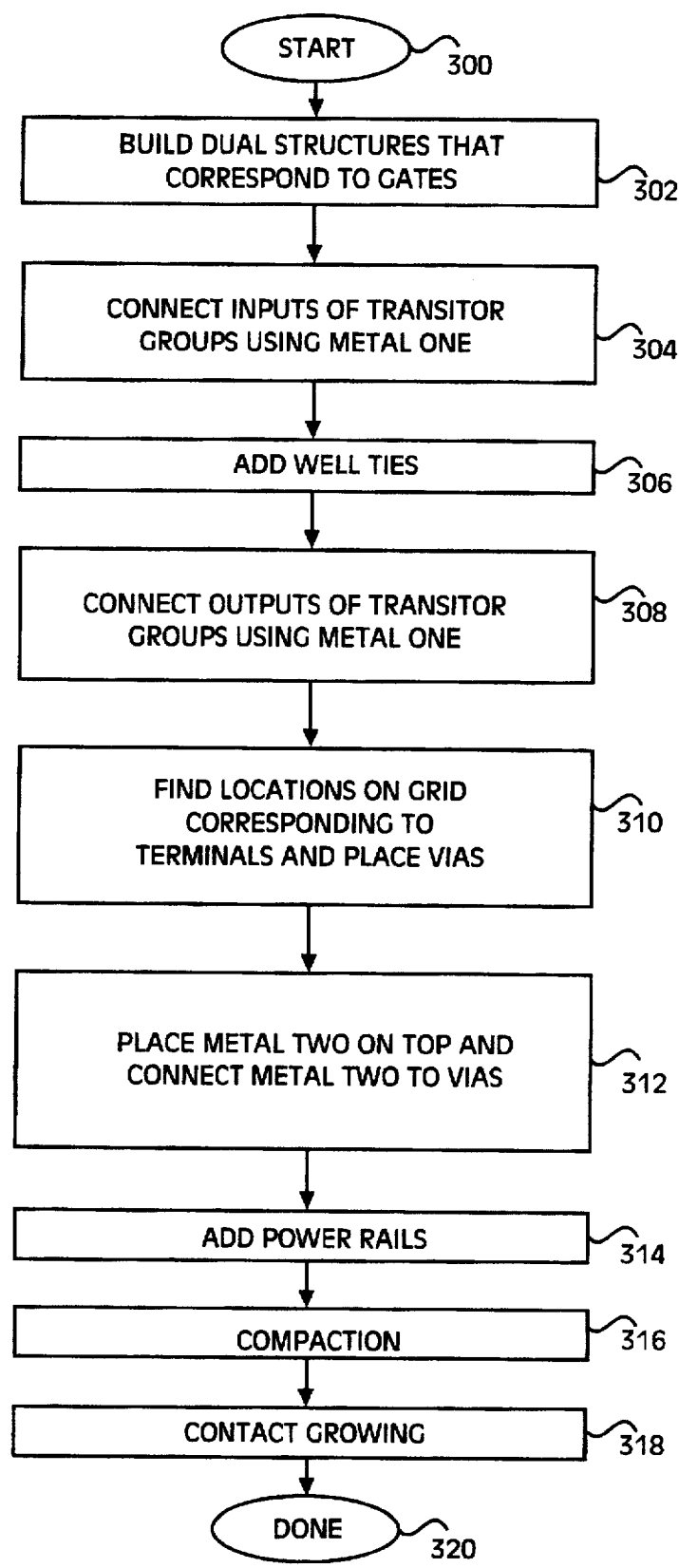
FIG. 6 shows in a simplified flowchart format the steps of the inventive method for implementing the layout generator of FIG. 5A.

FIG. 6 shows in a simplified flowchart format the steps of the inventive method for implementing layout generator 250 of FIG. 5A. FIG. 6 starts at step 300. From step 300, the inventive method proceeds to step 302 where the dual CMOS structures that correspond to the gates specified by behavioral description 252, number or inputs 254, drive strength 256, and criteria for interleaving 260 are built.

After the CMOS dual structure that corresponds to gates is built in step 302, the inventive method proceeds to step 304 wherein the inputs to the low strength complementary transistor groups are connected using conductors in a metal one layer. At this step, gates of transistors in a low strength complementary transistor group are first coupled together using polysilicon. The low strength complementary transistor groups that are supplemental to each others and built for the purpose of increasing the gate's drive strength have their polysilicon input wires coupled together using conductors in a metal one layer. The use of conductors in a metal one layer to connect together inputs of complementary transistor groups that are supplemental to one another advantageously improves speed and performance because, among other advantages, metal is a better conductor than polysilicon.

From step 304, the inventive method proceeds to step 306 wherein well ties are added. As is well-known to those skilled in the art, well ties are metal conductors coupled to well contacts. In an n-well process, well contacts represent regions of $n^+$ diffusion coupled directly to an n-well. The metal conductors serve to couple n-wells, by way of regions of $n^+$ diffusion, to Vdd.

The inventive method next proceeds to step 308 wherein the outputs of the low strength transistor groups, which constitute the half dual structures, are connected using conductors in the same metal one layer. At this stage, the logic functions of the cell are defined at the transistor level. To complete the cell layout, the method next proceeds to step 310 where a grid is superimposed on the cell layout completed thus far. Vias are then placed at grid points on the grid that correspond to cell terminals.

Each cell terminal represents an input or an output terminal of the cell. Because the input and output terminals represent inputs into or outputs out of the interconnected low strength complementary transistor groups, they reside on conductors in the metal one layer. If a metal one conductor that forms a cell terminal does not coincide with a grid point, it is preferably extended until at least a portion of that metal one conductor coincides with a grid point. Note that since metal one resides on a layer that is different from the polysilicon layer, the extension of metal one conductors to place them at grid points typically do not require the enlargement of the cell. In contrast, prior art methods use polysilicon wires for terminals in the crowded polysilicon layer. When a polysilicon wire is extended to get placed at a grid point, the extended polysilicon wire often results in design rules violation and necessitates an enlargement of the cell.

It should also be pointed out that metal one conductors are located in a layer that is different from the polysilicon layer. If conductors that couple together low strength transistors, e.g. conductors 295 and 296 of FIG. 5B, were implemented in the polysilicon layer, as was done in the prior art, it is often the case that cells have to be further enlarged to accommodate these additional polysilicon conductors as well as their contacts. Further, if conductors that couple low strength complementary transistor groups of the CMOS dual structure together, e.g. conductors 285, 286, and 287 of FIG. 5B, were implemented in the polysilicon layer, as was done in the prior art, it is often the case that cells again have to be further enlarged to accommodate these additional polysilicon conductors as well as their contacts. By coupling low strength transistors together using metal one conductors (e.g. conductors 295 and 296), as well as low strength complementary transistor groups of the CMOS dual structure together using metal one conductors (e.g. conductors 285, 286, and 287), transistors and half dual structures of the resultant cell can advantageously be placed closer together, thereby achieving a reduction in the overall cell size along with a concomitant improvement cell speed and performance.

Since the metal one layer is usually protected by a layer of interlayer dielectric, it is often necessary to etch through to the metal one layer in order to form an electrical contact between a via and a conductor in the metal one layer. The placement of vias at a grid point facilitates access to conductors in the metal one layer by place-and-route equipment. At this point, the vias define access to terminals of the cell. To couple cells together, conductors in a metal two layer may be coupled to vias. This is shown in step 312 of FIG. 6. The use of conductors in the metal two layer, which conductors are coupled to metal one conductors by the aforementioned vias, advantageously reduces chip size when cells are coupled in blocks. This is because it is not necessary to make room in the polysilicon layer for wires and contacts, as would be required if polysilicon wires were instead used.

The method then proceeds to step 314 wherein power rails are added to selected sources of transistors of the low strength transistor groups. Power rails are connected using conductors in the metal one layer. Power rails include conductors to Vdd and conductors to Vss. Design rules often specifies that metal conductors to Vdd and Vss must be of a certain size to properly withstand thermal and mechanical stress.

From step 314, the inventive method proceeds to step 316 where the cell is compacted to reduce area usage. During compaction, the cell components are moved in the direction in which the half dual structures are aligned in order to, for example, reduce the length of the polysilicon conductors that couple together gates of the complementary low strength transistor groups, e.g. polysilicon wires 281, 282, 283, and 284 of FIG. 5B. Compaction is preferably done using an align methodology.

Further, the cell components and device components are preferably placed as close together as possible during compaction without violating the design rules. In one embodiment, compaction is performed with the assistance of the ALIGN and ACAP tools furnished in the Mentor Graphics Genie tool set. From step 316, the inventive method proceeds to step 318 where diffusion contacts between metal one conductors and diffusion regions are preferably grown to reduce resistance and parasitic capacitances. After the diffusion contacts are grown, the inventive method proceeds to step 320, representing the end of the inventive layout generation method of FIG. 6.

In one embodiment, layout generator 250 advantageously generates cell layouts that are parameterizable in a highly efficient manner. A cell layout that is parameterizable is one for which there may exist other cell layouts that are essentially variations of that base cell layout but have different drive strengths and/or number of inputs. For example, a cell layout such as a NAND-2 cell layout may be parametrized to derive NAND-3, NAND-4, and NAND-5 cell layouts. Further, the same NAND-2 cell layout may be parametrized to derive another NAND-2 cell layout, or other NAND cell layouts that have different input combinations, each of those cell layouts may further have a drive strength that is different from the drive strength of the base NAND-2 cell layout. Candidates for parameterizable cell layouts include, among others, AND, NAND, NOR, OR, NOT, and other gates that are combinations of AOI (AND/OR/INVERT) and OAI (OR/AND/INVERT) gates.

Once a layout generator 250 is created in accordance with the inventive method disclosed herein, a user may input into that same layout generator 250 sets of data, each comprising behavioral description 250, number of inputs 254, drive strength 256, and design rules 258, to generate various layout views representing variations of a parameterizable cell layout. As an example, consider a basic parameterizable cell layout, such as a NOR-2 cell layout, that is capable of having up to ten different inputs and ten possible drive strengths. To generate all the possible cell layout combinations, the prior art method would require the manual creation of 100 cell layouts (10×10). In contrast, the present invention requires the creation of only a single layout generator 250 for generating cell layouts that implement the NOR behavioral description. The user may then enter design rules 258 and various input/drive strength combinations into that layout generator 250 to generate cell layouts that are variations of the parameterizable base NOR-2 cell layout, e.g. NOR-2, NOR-3, NOR-4 with different drive strengths.

The inventive method of FIG. 6 may be better visualized using a cell layout example. In the example of FIGS. 7-11, a process of generating a cell layout using the inventive method of FIG. 6 is shown. The cell chosen to illustrate the inventive method of FIG. 6 is arbitrarily chosen to be a NAND-2 gate having a drive strength of twice the drive strength of a low strength NAND gate. In other words, the behavioral description 252 is a NAND gate, the number of inputs 254 is two, the drive strength 256 is two units. Further, transistors in the cell chosen for illustration are arbitrarily determined to be noninterleaved, according to a criteria for interleaving 260. The cell layout illustrated in FIGS. 7-11 is preferably generated using, among others, the Mentor Graphics Genie tool set, particularly the ALIGN and ACAP tools furnished therewith.

Figure 7A:
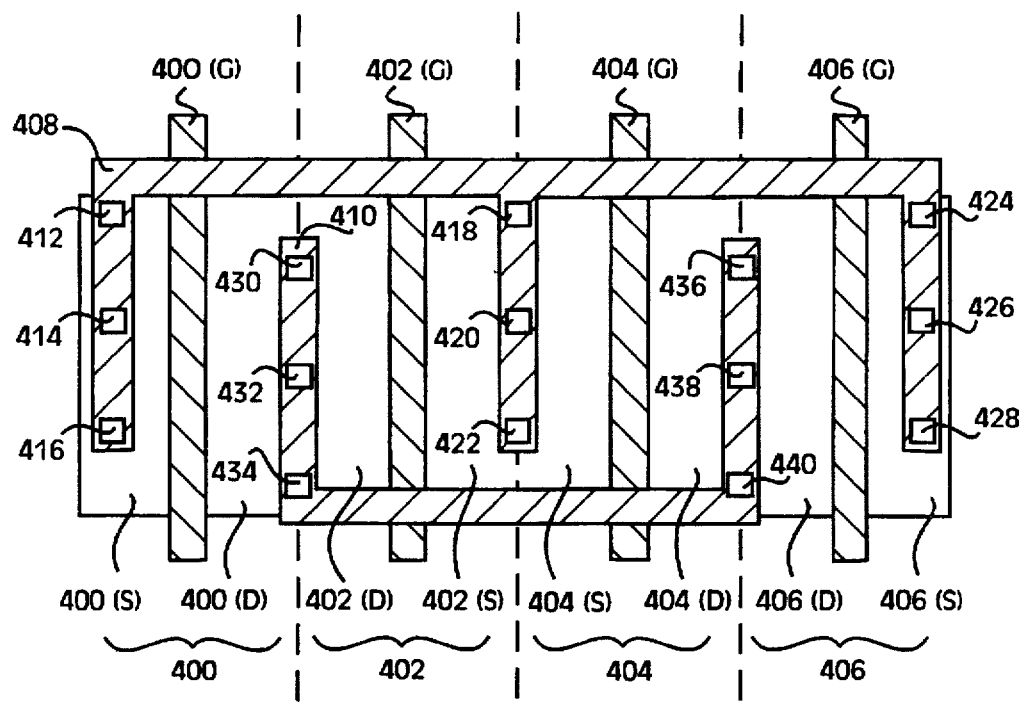
FIG. 7A shows in a simplified format a pMOS half dual structure used to create the NAND-2 cell of the present example.

FIG. 7A shows in a simplified format a pMOS half dual structure used to create the NAND-2 cell of the present example. The pMOS structure of FIG. 7A represents one of the two half dual structures comprising a CMOS dual structure that corresponds to a NAND-2 cell. Referring now to FIG. 7A, shown are a plurality of pMOS transistors 400, 402, 404, and 406 placed adjoining one another and wired in parallel.

Transistor 400 includes a source region 400 (S), a polysilicon gate 400 (G), and a drain region 400 (D). Transistor 402 includes a drain region 402 (D), a polysilicon gate 402 (G), and a source region 402 (S). PMOS transistors 400 and 402 represent the pMOS low strength transistor group for implementing a low strength CMOS NAND-2 gate.

FIG. 7A also shows a pMOS low strength transistor group comprising transistors 404 and 406, which, in the case of FIG. 7A, replicate transistors 400 and 402 to roughly double the drive strength of the pMOS half dual structure of FIG. 7A. Transistor 404 includes a source region 404 (S), a polysilicon gate 404 (G), and a drain region 404 (D). Adjoining transistor 404 is transistor 406, which includes a drain region 406 (D), a polysilicon gate 406 (G), and a source region 406 (S). As is well known to those of skilled in the art, the source and drain regions of transistors 400, 402, 404, and 406 represent diffusion regions defining drains and sources. In an n-well process, the diffusion regions may represent p⁺ regions located in a well of n-type diffusion. Further, the entire CMOS dual structure is typically built on a p-type substrate. Each of polysilicon gates 400 (G), 402 (G), 404 (G), and 406 (G) typically has a certain dimension governed by the inputted set of design rules and are typically separated from n-well diffusion areas by a layer of thin oxide.

It should be noted that the transistors 400, 402, 404, and 406 are preferably placed such that adjoining transistors have common shared drains and shared sources. For example, transistors 400 and 402 have a shared drain region comprising regions 400 (D) and 402 (D). Likewise, transistors 402 and 404 have a shared source region comprising regions 402 (S) and 404 (S). In the same manner, transistors 404 and 406 have a shared drain region comprising regions 404 (D) and 406 (D).

FIG. 7A further shows two metal conductors 408 and 410 for coupling the source and drain regions of transistors 400, 402, 404, and 406 together in parallel. Conductors 408 and 410 are preferably made of a metal conducting material such as aluminum, and are located in a metal one layer. Conductor 408 couple source region 400 (S) with the shared source region comprising source regions 402 (S) and 404 (S), as well as with source region 406 (S). To prevent shorting, conductor 408, as well as other conductors in the metal one layer, is typically insulated from the transistor components, e.g. the polysilicon gate and the source and drain diffusion regions, by at least a layer of dielectric material which serves as a spacing layer.

To ensure proper contact between conductor 408 and each of the source regions 400 (S), 402 (S), 404 (S), and 406 (S), a plurality of metal contacts, also known as diffusion contacts, are provided at the junction of conductor 408 and each of the aforementioned source regions. For example, metal contacts 412, 414, and 416 couple conductor 408 through to source region 400 (S). Similarly, conductor 408 is coupled to the shared source region comprising region 402 (S) and region 404 (S) by three metal contacts 418, 420, and 422. In the same manner, conductor 408 is coupled to source region 406 (S) by three metal contacts 424, 426, and 428. It should be noted that although the coupling between conductor 408 and each of the aforementioned source regions is achieved by using three contacts, a greater or fewer number of metal contacts may be used.

Conductor 410 serves to couple drain regions of transistors in the pMOS half dual structure of FIG. 7A together. Conductor 410 is coupled to the shared drain region comprising drain regions 400 (D) and 402 (D) with the shared drain region comprising drain regions 404 (D) and 406 (D). The coupling between conductor 410 and the aforementioned shared drain regions are made using contacts 430, 432, 434, 436, 438, and 440 respectively. It should be noted that transistors 400, 402, 404, and 406 in FIG. 7A are oriented in one direction, e.g. the vertical direction in the example of FIG. 7A. Further, it is preferable that the transistors are built one after another in an align and as-close-as-possible manner without violating the design rules. In the preferred embodiment, the ALIGN and ACAP tools in the Mentor Graphics Genie tool set are used to align transistors and to achieve as close as possible spacing during the building process.

Figure 7B:
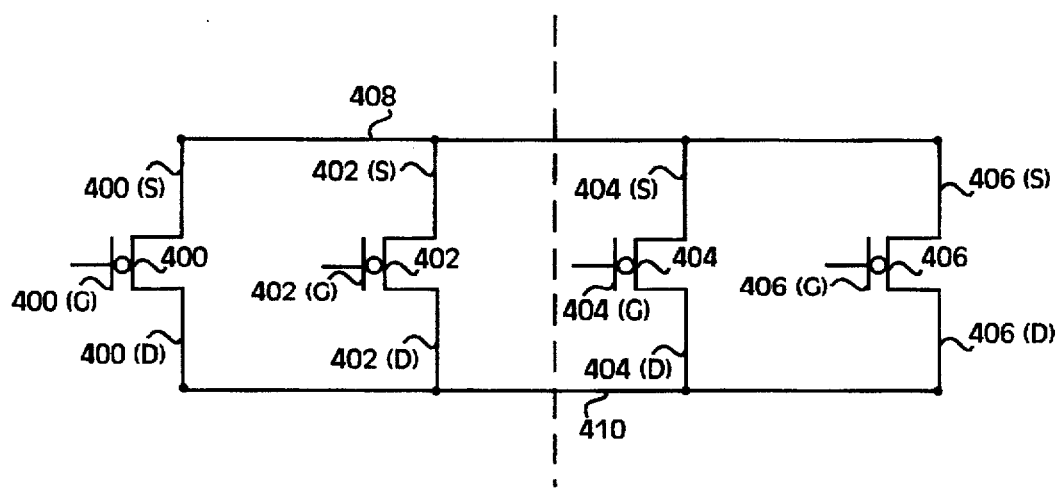
FIG. 7B shows in a simplified circuit drawing the transistors of FIG. 7A.

FIG. 7B shows in a simplified circuit drawing, the transistors 400, 402, 404, and 406 of FIG. 7A. FIG. 7B clearly shows the parallel connection between the transistors of the pMOS half dual structure using conductors 408 and 410.

Figure 7C:
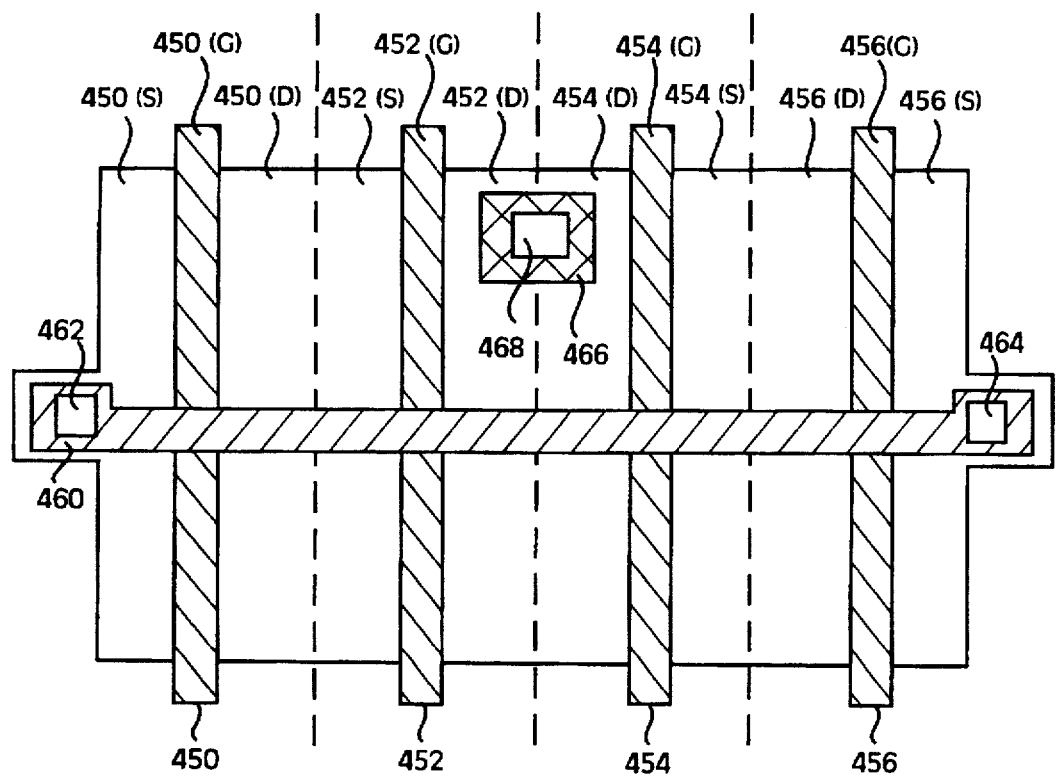
FIG. 7C shows in a simplified format the nMOS low strength transistor groups constituting the nMOS half dual structure.

FIG. 7C shows, in a simplified format, the nMOS low strength transistor groups constituting the nMOS half dual structure that is used in conjunction with the pMOS transistors of FIG. 7A to create the CMOS NAND-2 cell of the selected example. Referring to FIG. 7C, shown are a plurality of nMOS transistors 450, 452, 454, and 456. Each of transistors 450, 452, 454, and 456 is preferably created using an align method. Further, it is preferable that the aforementioned nMOS transistors be placed as close to one another as possible without violating the design rules using, for example, the ALIGN and ACAP tools of the Mentor Graphics Genie tool set. The nMOS transistors, like their pMOS counterparts, are preferably built sequentially in one direction, e.g. from left to right or right to left depending on specification.

NMOS transistor 450 includes a source region 450 (S), a drain region 450 (D), and a polysilicon gate 450 (G). Adjoining nMOS transistor 450 is nMOS transistor 452, which includes a source region 452 (S), a drain region 452 (D), and a polysilicon gate 452 (G). Note that the drain region of nMOS transistor 450, drain region 450 (D), is coupled to the source region of nMOS transistor 452, source region 452 (S), forming a series connection. NMOS transistors 450 and 452 form an nMOS low strength transistor group which, in combination with the pMOS low strength transistor group comprising pMOS transistors 400 and 402, makes up a low strength CMOS NAND-2 gate.

NMOS transistors 454 and 456 represent a supplemental low strength transistor group which is used to supplement the low strength transistor group comprising nMOS transistors 450 and 452 to approximately double the drive strength of the nMOS half dual structure of FIG. 7C. NMOS transistor 454 includes a drain region 454 (D), a source region 454 (S), and a polysilicon gate 454 (G). Note that the drain region of nMOS transistor 454, drain region 454 (D), is coupled to the drain region of nMOS transistor 452, drain region 452 (D), by virtue of a shared drain region comprising drain region 452 (D) and drain region 454 (D). NMOS transistor 456 includes a drain region 456 (D), a source region 456 (S), and a polysilicon gate 456 (G). As with nMOS transistors 450 and 452, nMOS transistors 454 and 456 are serially connected at their respective source and drain regions 454 (S) and 456 (D).

FIG. 7C also shows a conductor 460 for coupling the sources of nMOS transistors 450 and 456 together. Conductor 460 is preferably made of a metal conducting material and located in the aforementioned metal one layer. To make contact with the diffusion regions that form the sources of transistors 450 and 456, metal contacts are made from conductor 460 through to the respective diffusion regions. FIG. 7C shows two such metal contacts 462 and 464 for coupling conductor 460 respectively to source region 450 (S) and source region 456 (S). Another conductor 466, also preferably made of a metal conducting material and located in the aforementioned metal one layer, is also shown in FIG. 7C. Metal conductor 466 is coupled to the shared drain region comprising drain 452 (D) and drain 454 (D) by a metal contact 468.

As in the case of their pMOS counterparts, each of nMOS transistors 450, 452, 454, and 456 is preferably oriented along one direction, e.g. the vertical direction in the example of FIG. 7C. Further, it is preferable that the nMOS half dual structure of FIG. 7C be oriented with the pMOS half dual structure of FIG. 7A along the same direction, e.g. the vertical direction in the example of FIGS. 7A and 7C. In one embodiment, the nMOS half dual structure of FIG. 7C is placed below the pMOS half dual structure of FIG. 7A alone the vertical direction.

Figure 7D:
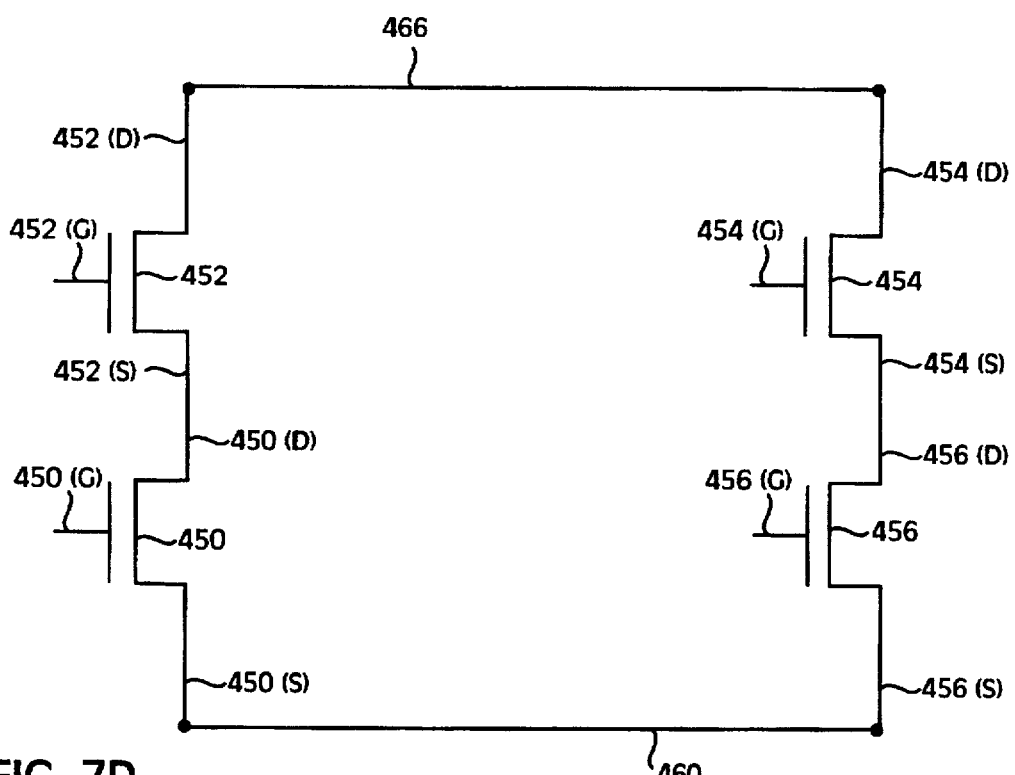
FIG. 7D shows in a simplified circuit format the transistors of FIG. 7C.

FIG. 7D shows in a simplified circuit format the transistors of FIG. 7C. NMOS transistors 450 and 452 are shown in FIG. 7D to be connected in series by virtue of their shared regions 450 (D) and 452 (S). Likewise, nMOS transistors 454 and 456 are connected in series as shown in FIG. 7D by virtue of their shared regions 454 (S) and 456 (D). The connection between the low strength transistor groups comprising nMOS transistors 450 and 452 and the low strength transistor group comprising nMOS transistors 454 and 456 are made by coupling drain region 452 (D) with drain region 454 (D) by virtue of a shared drain region comprising drains 452(D) and 454(D). Another connection between the transistor groups of FIGS. 7C–D is made at source region 450 (S) and source region 456 (S) using metal conductor 460.

Figure 8A:
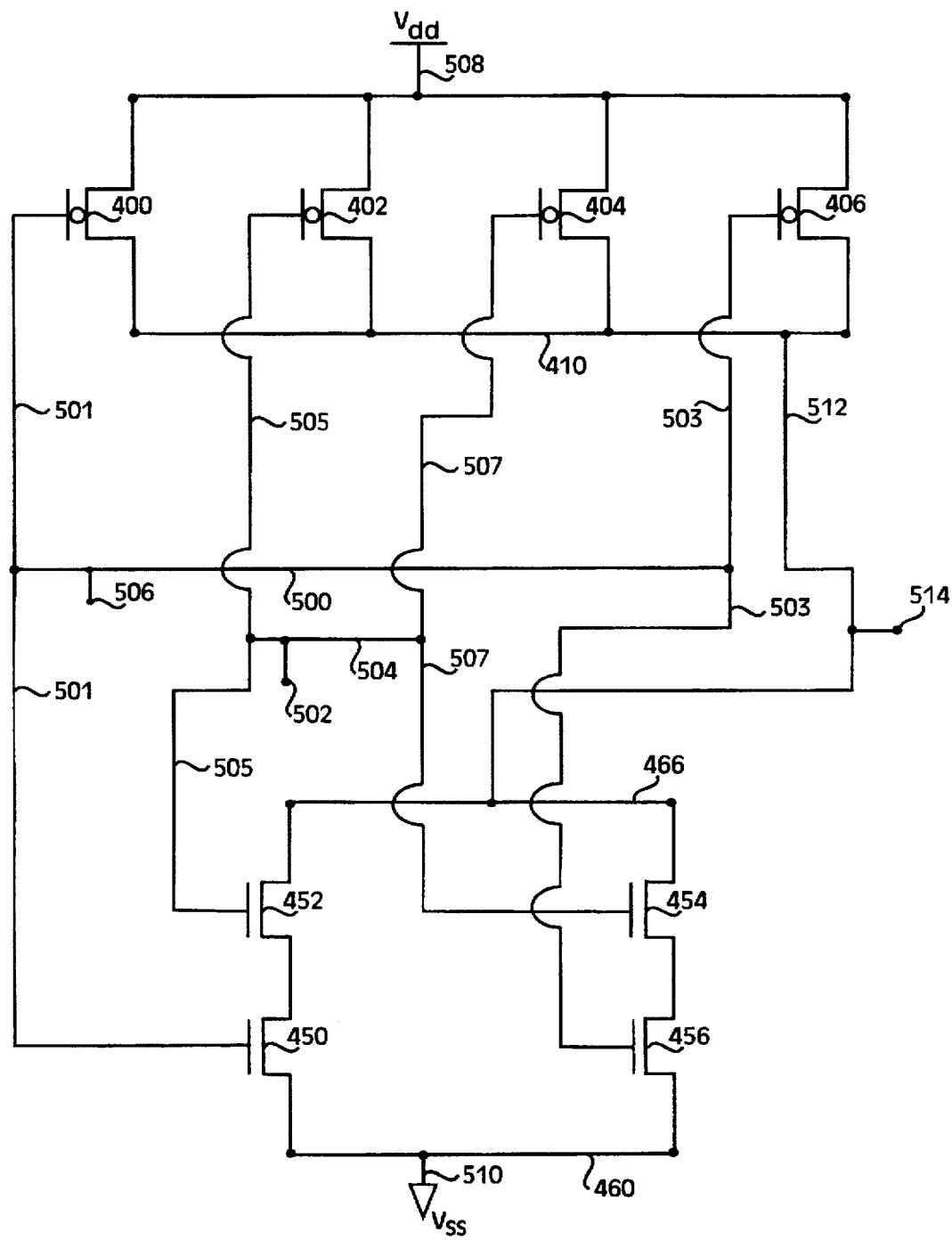
FIG. 8A shows in a simplified circuit format the two half dual structures of FIGS. 7A and 7C, further including the input connections, the output connections, as well as the Vdd and the Vss connections.

FIG. 8A shows in a simplified circuit format the two half dual structures of FIGS. 7A and 7C, further including the input connections, the output connections, as well as the Vdd and the Vss connections. The pMOS half dual structure of FIG. 7A is reproduced at the top of FIG. 8A while the nMOS half dual structure of FIG. 7C is reproduced at the bottom of FIG. 8A. Polysilicon wire 501 couples together gates of transistors 400 and 450 while polysilicon wire 503 couples together gates of transistors 406 and 456. FIG. 8A shows a metal one conductor 500 which couples together the gates of transistors 400, 406, 450, and 456. As shown in FIG. 8A, metal one conductor 500 accomplishes this coupling by connecting polysilicon wires 501 and 503 together. There is provided on metal one conductor 500 a terminal connection 506 facilitating access to the gate of transistors 400, 406, 450, and 456. Terminal connection 506 is preferably at a grid point to facilitate access by place-and-route equipment.

Similarly, a conductor 504 couples together gates of transistors 402, 404, 452, and 454 by interconnecting polysilicon wires 505 and 507 together. Note that polysilicon wire 505 couples together gates of transistors 402 and 452 while polysilicon wire 507 couples together gates of transistors 404 and 545. There is provided on conductor 504 a terminal connection 502, also at a grid point, for facilitating access by place-and-route equipment. The CMOS dual structure of FIG. 8A is coupled to Vdd and Vss by conductors 508 and 510 respectively. A metal conductor 512, also located on the metal one layer, couples conductor 410 with conductor 466, thereby coupling the drains of pMOS transistors 400, 402, 404, and 406 with the drains of nMOS transistors 452 and 454. There is provided on conductor 512, a terminal connection 514, also at a grid point, for facilitating access by place-and-route equipment.

As is apparent from the circuit diagram of FIG. 8A, pMOS transistors 400, 402, 404, and 406, together with their nMOS counterparts, transistors 450, 452, 454, and 456, along with conductors 500, 504, 508, 510, and 512, form two two-input NAND gates of lower strength which are coupled in parallel to provide greater drive strength. Metal one terminal connections 502 and 506 represent the two input terminals into the cell of FIG. 8A while metal one terminal connection 514 represents the output terminal of the NAND-2 cell of FIG. 8A.

Figure 8B:
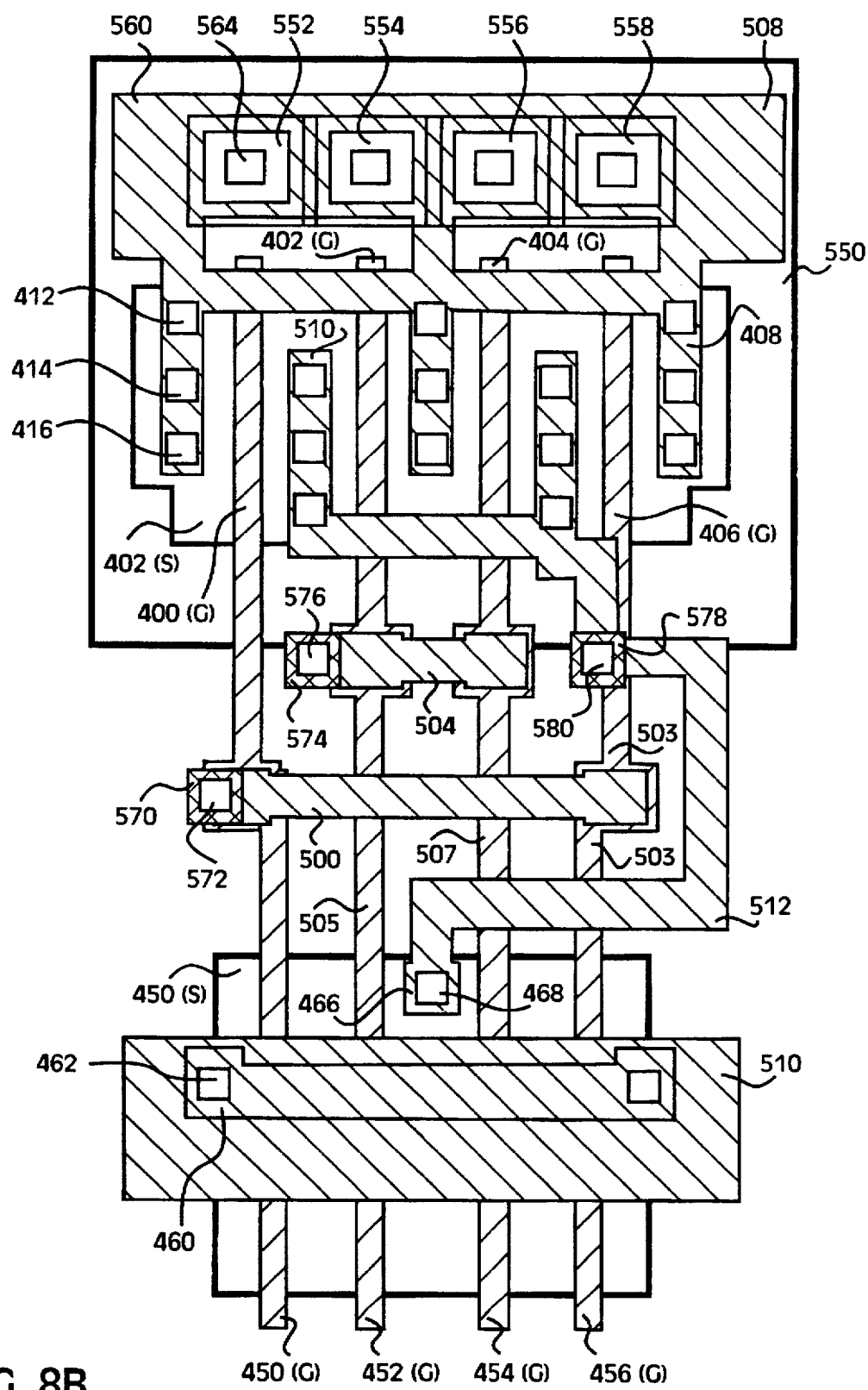
FIG. 8B shows in a simplified format a layout view of the cell implementing a NAND-2 gate, including the input connections, the output connections, the well ties, the vias, and the power rails.

FIG. 8B shows, in a simplified format, the layout view of the cell implementing a NAND-2 gate, including the input connections, the output connections, the well ties, the vias, and the power rails. FIG. 8B represents the lay out view of the NAND-2 cell of the present example after steps 302, 304, 306, 308, 310, 312, and 314 of FIG. 6 have been performed. Shown is an n-well 550, represented by the shaded region in the upper portion of FIG. 8B. Within n-well 550, pMOS transistors 400, 402, 404, and 406 are formed. For purpose of identification, gates 400 (G), 402 (G), 404 (G), and 406 (G) are shown in FIG. 8B.

NMOS transistors 450, 452, 454, and 456, represented by gates 450 (G), 452 (G), 454 (G), and 456 (G) respectively, are also shown in FIG. 8B. Although not shown in FIG. 5B, it should be understood that the transistors of FIG. 8B, as well as n-well 550, sit in a substrate of a p-type material.

Also, shown are a plurality of metal well ties 552, 554, 556, and 558. As is well known to those skilled in the art, each of well ties 552, 554, 556, and 558 is coupled to underlying n-well 550 by way of an n$^+$ well contact region. For example, well tie 552 is coupled to n-well 550 by way of n$^+$ well contact region 560. Because of the existence of an interlayer dielectric covering the diffusion regions, a metal contact 564 is typically made through to underlying well contact region 560 from well tie 552.

Note that the use of metal conductors and vias permit well ties to be placed directly above a cell well. In contrast, prior art layout methods are constrained to place well ties beside the dual CMOS structure. This is because prior art methods use polysilicon wires to couple well contact regions to Vdd or Vss. For example, if polysilicon wires and terminals, such as those used in the prior art, were used to couple well contact regions, such as n$^+$ well contact region 560, to Vdd, it is not possible to place those polysilicon wires and terminals directly above a well. This is because in modern self-aligning gate processes, polysilicon cannot be placed over areas which need to be implanted to form well contact diffusion areas. Because the present invention does not employ polysilicon wires and terminals to couple well contacts to Vdd or Vss, well ties may advantageously be placed above the cell to reduce cell size.

It should be noted that although well ties 552, 554, 556, and 558 are placed above the CMOS dual structure of FIG. 8B, the inventive method can dynamically position well ties either above the CMOS dual structure, as shown in FIG. 8B, or beside the CMOS dual structure, e.g. next to the pMOS half dual structure. Layout generator 250 of the present invention preferably determines, in a dynamic manner at run time, the locations of well ties responsive to a user command that is inputted into layout generator 250 prior to run time. For example, the user may specify that well ties should always be placed above the CMOS dual structure.

Alternatively, the user may input a set of predefined conditions into layout generator 250, e.g. always place well ties above the CMOS dual structure unless by so doing the cell height exceeds a predefined height, to permit layout generator 250 to dynamically position well ties during the layout generation process. The final location of the well ties are then determined by the method at run time as the cell is created. The ability to dynamically position well ties, e.g. well ties 552, 554, 556, and 558, either above or beside the CMOS dual structure to either optimize cell size and/or maintain a standard cell height represents a major advantage of the present inventive method. If the location of the well ties are determined based on a set of predefined conditions, e.g. always place well ties above the CMOS dual structure unless by so doing the distance from the well ties to the top edge of the cell becomes less than some predefined value, design rules independence with regard to the placement of well ties are advantageously achieved. In other words, the designer does not have to specify beforehand the location of the well ties. The location of the well ties are determined for the designer by the inventive method depending on the values of the design rules and the set of predefined conditions.

To couple gates 400 (G), 450 (G), 406 (G), and 456 (G) together in the manner shown in FIG. 8A, FIG. 8B shows metal conductor 500 of FIG. 5A coupling polysilicon wires 501 with polysilicon wire 503. FIG. 8B also shows a metal two conductor region 570 coupled to a via 572. Via 572 is used to couple metal two conductor region 570 through to terminal connection 506 (illustrated in FIG. 8A and omitted in FIG. 8B for clarity), which is in turn coupled to conductor 500 in the metal one layer. In this manner, via 572 facilitates access to conductors in the metal one layer from metal two conductor region 570. As discussed earlier, via 572 is preferably placed at a grid point. As is well known to those skilled in the art, metal layers, such as metal two layer and metal one layer of the present example, are typically separated by a layer of dielectric. Consequently, the presence of via 572 at a grid point permits place-and-route equipment to access cell terminals in the underlying metal one layer even though the metal one layer is covered by a dielectric layer.

In the same manner, gates 402 (G), 404 (G), 452 (G), and 454 (G) are coupled together by metal conductor 504. To facilitate access to metal conductor 504 in the metal one layer, a metal two conductor region 574 and a via 576 are also shown. Via 576 is also preferably located at a grid point and serves to couple metal two conductor region 574 through to terminal connection 502 (illustrated in FIG. 5A and omitted in FIG. 8B for clarity) on conductor 504. As is apparent, metal two conductor region 574 and via 576 facilitate access to metal conductor 504 in the metal one layer. Since metal conductors 500 and 504 serve as inputs into the NAND-2 gate, vias 572 and 576 serve to provide access to the two input terminals of the NAND-2 gate of the present example.

FIG. 8B also shows conductor 512 coupling conductor 410, which is coupled to selected drains of pMOS transistors, with conductor 466, which is coupled to selected drains of nMOS transistors. As is apparent, this connection serves to couple the drains of the transistors in the pMOS half dual structure with selected drains of the transistors in the n-type half dual structure, forming an output terminal. There is also shown in FIG. 8B a metal two conductor region 578 which is coupled through to underlying terminal connection 514 (illustrated in FIG. 8A and not shown in FIG. 8B for clarity) on conductor 512 in the metal one layer. Metal two conductor region 578 is coupled through to the aforementioned terminal connection 514 by a via 580. Via 580 is preferably placed at a grid point to facilitate access by standard place-and-route equipment, similar to via 572 and 576.

FIG. 8B also shows conductor 508 in the metal one layer coupling conductor 408 to Vdd. Also in the metal one layer, shown is a conductor 510, coupling conductor 460 with Vss.

Figure 9:
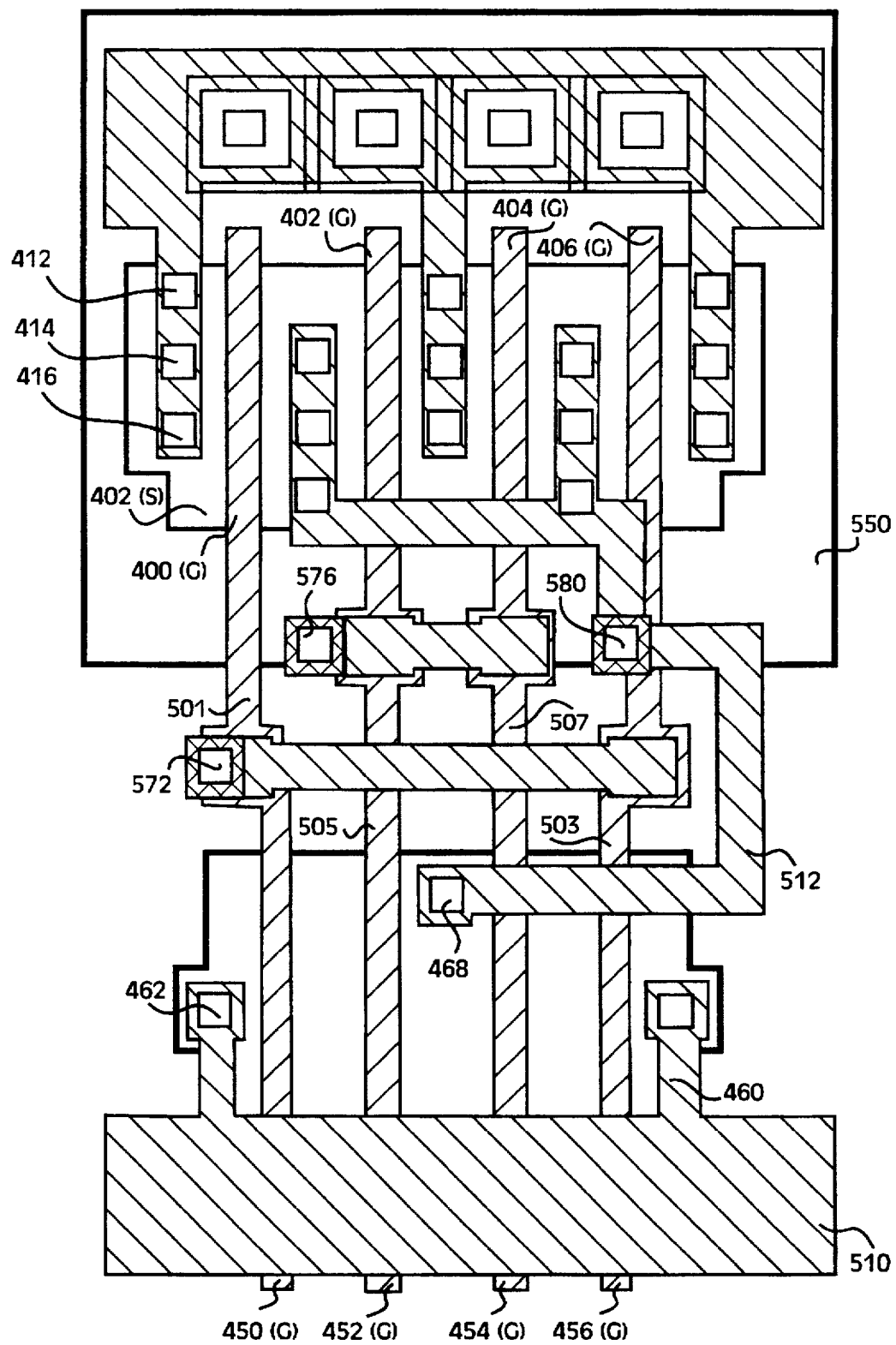
FIG. 9 shows in a simplified format the layout of FIG. 8B after compaction is performed.

FIG. 9 shows, in a simplified format, the layout of FIG. 8B after compaction is performed. During compaction, polysilicon wires 501, 503, 505, and 507 are shortened. Compaction advantageously reduces the length of polysilicon wires, thereby reducing the distance charges have to travel within the cell. Because the polysilicon wires 501, 503, 505, and 507 between the two complementary half dual structures are shortened during compaction, the height of the resultant cell is advantageously reduced thereby. During compaction the cell components and device components are preferably moved using an align method and be placed as-close-as-possible to one another without violating the design rules. In one embodiment, compaction is performed using the ALIGN and ACAP tools of the Mentor Graphics Genie tool set.

Note that when the polysilicon wires are shortened, the n-type half dual structure, comprising transistors 450, 452, 454, and 456, may be moved closer to the p-type half dual structure, which comprises transistors 400, 402, 404, and 406 as in the case of the example of FIG. 9. During compaction, metal conductors coupling the two half dual structures together may also be altered. For example, conductor 512 of FIG. 8B is shortened when the nMOS half dual structure moves closer to the p-type half dual structure. On the other hand, certain metals conductors may be lengthened to accommodate compaction. For example, conductor 460 of FIG. 8B is lengthened to maintain electrical contact with conductor 510 during compaction. The lengthened conductor 460 is shown in FIG. 9.

Figure 10:
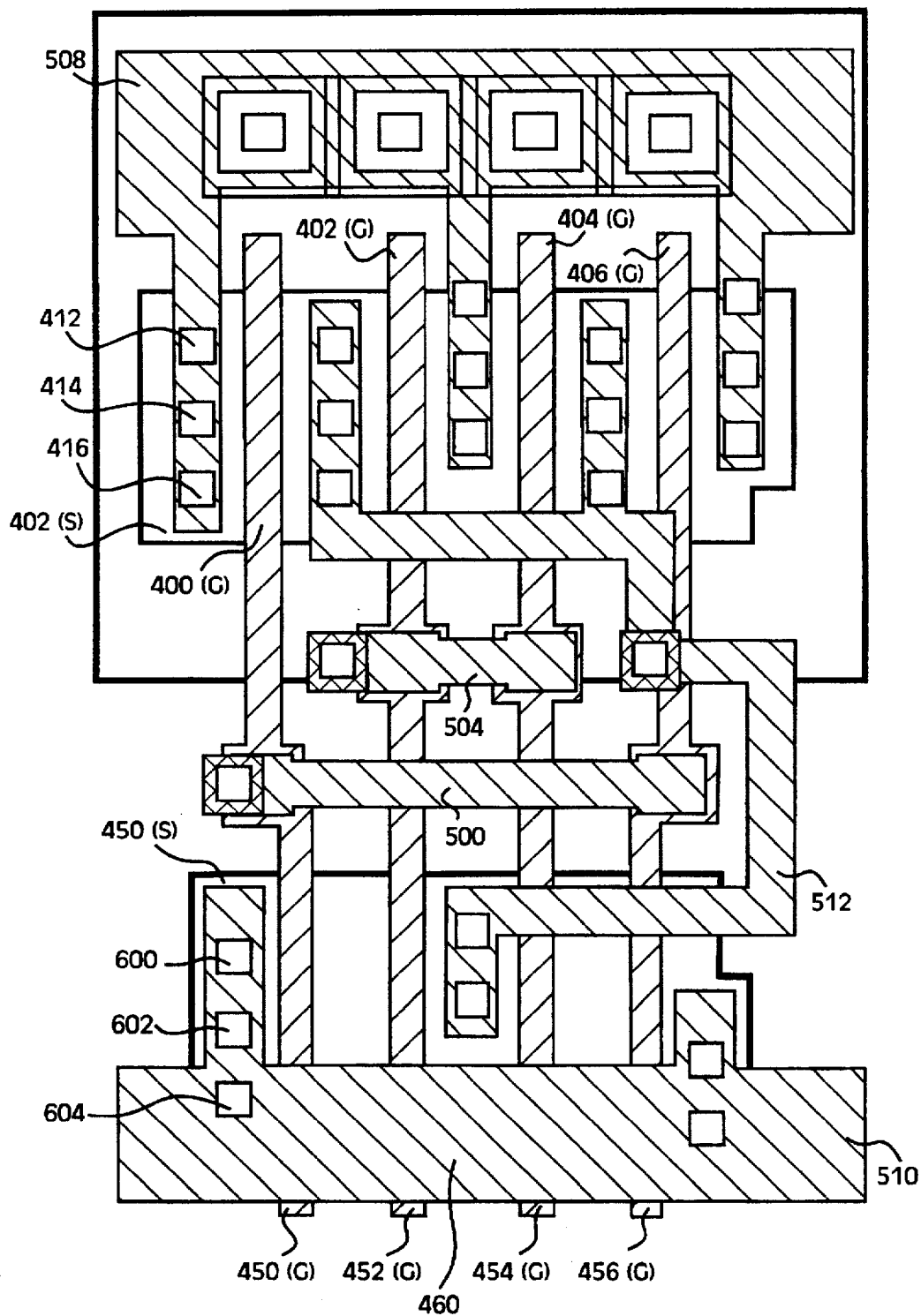
FIG. 10 shows the cell layout after the contact growing step of FIG. 6 is performed.

FIG. 10 shows the cell layout after the contact growing step 316 of FIG. 6 is performed. Following compaction, certain diffusion contacts are "grown" to improve conduction and reduce parasitic capacitances. For example, metal contacts 412, 414, and 416 of FIG. 7A, which couples source region 400 (S) of pMOS transistor 400 to conductor 408, are spaced more evenly within source region 400 (S). To provide a greater contact area, portions of conductor 408 is advantageously lengthened to substantially cover source region 400 (S). During contact growing, the inventive method also advantageously eliminates any metal conductor or portions of a metal conductor that is unnecessary. For example, the top bar of conductor 408, which is shown in FIG. 7A, is eliminated in FIG. 10 because the same function is provided by metal conductor 508.

As a further example, the portion of conductor 460 that is coupled to source region 450 (S) is advantageously lengthened to provide a greater contact surface. Instead of one metal contact 462 shown in FIG. 7C, three metal contacts 600, 602, and 604 are used to couple conductor 460 to source region 450 (S). As is apparent from an inspection of FIG. 10, metal conductors are advantageously enlarged, and if possible, multiple contacts are provided to couple conductors to diffusion areas.

Figure 11:
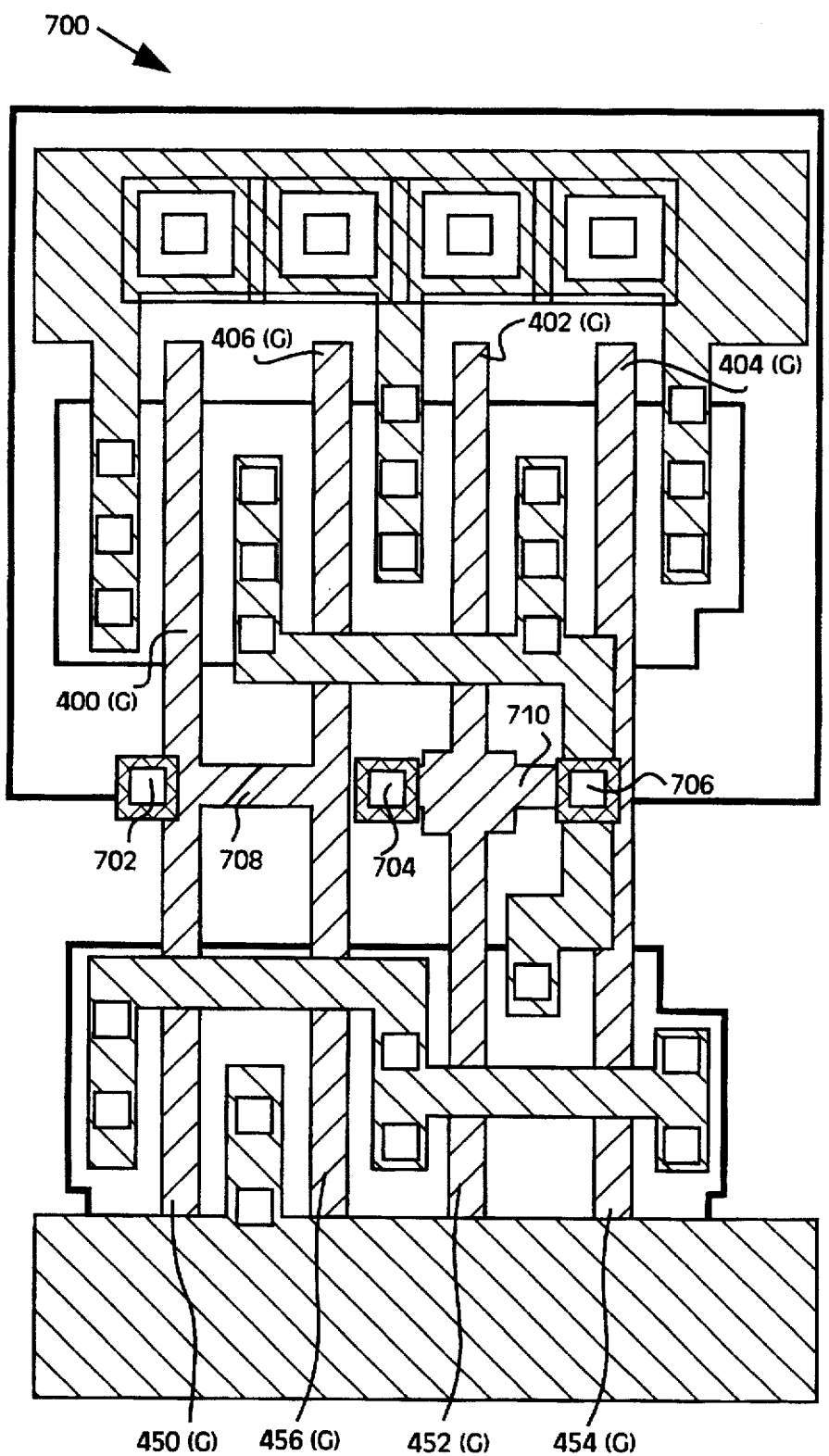
FIG. 11 shows a NAND-2 cell layout generated in accordance with the inventive technique in which transistors are interleaved.

In another aspect of the present invention, the transistors in low strength transistor groups that make up the half dual structures can advantageously be interleaved. Referring to FIG. 11, there is shown a cell layout 700 representing a CMOS NAND-2 gate that is created in accordance with the inventive method herein using an interleaving method. In contrast to the noninterleaved layout of FIG. 10, which connects the pMOS transistors in the order (from left to right) 400, 402, 404, and 406, interleaved cell layout 700 shows the pMOS transistors connected in the order (again, from left to right) 400, 406, 402, and 404.

The noninterleaved method that results in the noninterleaved cell layout of FIG. 10 creates a first pMOS low strength transistor group comprising two pMOS transistors 400 and 402. The pMOS low strength transistor group comprising two pMOS transistors 400 and 402 make up one half of a low strength 2-input CMOS NAND gate (the other half being the nMOS transistors 450 and 452). The noninterleaved method then provide a supplemental low strength transistor group comprising supplemental pMOS transistors 404 and 406. The supplemental low strength transistor group comprising supplemental pMOS transistors 404 and 406 are then placed adjoining the low strength transistor group comprising pMOS transistors 400 and 402 and wired in parallel to increase the drive strength of the resultant noninterleaved CMOS NAND-2 cell. Consequently, the resultant noninterleaved pMOS transistors that make up the pMOS half dual structure are ordered (from left to right) 400, 402, 404, and 406.

On the other hand, the interleaved method that results in the interleaved cell layout of FIG. 11 first creates a first pMOS transistor 400 for the first input of the CMOS NAND-2 gate. Next, a supplemental pMOS transistor 406 is supplied, placed adjoining pMOS transistor 400, and wired in parallel to increase the drive strength of the first input of the CMOS NAND-2 gate. Then, the interleaved method creates a second pMOS transistor 402 for the second input of the CMOS NAND-2 gate. This second pMOS transistor is placed adjoining pMOS transistor 406. At this point, pMOS transistor 406 is "interleaved" between the pMOS transistors 400 and 402. Next, a supplemental pMOS transistor 404 is provided, placed adjoining pMOS transistor 402, and wired in parallel with pMOS transistor 402 to increase the drive strength of the second input of the CMOS NAND-2 gate. As is apparent, the interleaved method place transistor groups that are supplemental to one another adjacent each other. Consequently, the resulting interleaved pMOS transistors of FIG. 11 are ordered (from left to right) 400, 406, 402, and 404.

In a similar manner, nMOS transistors of the interleaved layout of FIG. 11 are interleaved to create the interleaved nMOS structure of FIG. 11, which has the order (from left to right) 450, 456, 452, and 454. In contrast, the nMOS transistors of the noninterleaved layout of FIG. 10 are ordered (from left to right) 450, 452, 454, and 456.

When transistors are interleaved, the resultant CMOS cell may be made shorter in height. This is because it is not necessary couple together gates of transistors in low strength complementary transistor pairs that are supplemental of one another, e.g. transistor pairs 400/450 and transistor pairs 406/456 of the noninterleaved cell layout of FIG. 10, with metal one conductors (e.g. metal one conductor 500). In the interleaved layout of FIG. 11, gates of transistors in the complementary transistor pair comprising transistors 400/450 are instead coupled to gates of transistors in the complementary transistor pair comprising transistors 406/456 using polysilicon wire 708. Similarly, gates of transistors in the complementary transistor pair comprising transistors 402/452 are coupled to gates of transistors in the complementary transistor pair comprising transistors 4404/454 using polysilicon wire 710. Since there are no metal one conductors coupling together gates of transistors in low strength complementary transistor pairs that are supplemental of one another, e.g. gates of transistor pairs 400/450 and transistor pairs 406/456, the cell area typically occupied by metal one conductors and contacts in between the complementary half dual structures can advantageously be reduced. As an illustration, metal one conductors 500 and 504 of the noninterleaved layout of FIG. 10, along with their associated metal one contacts, are no longer necessary and are omitted from the interleaved layout of FIG. 11. Consequently, the interleaved cell is often shorter in height.

Although interleaving advantageously reduces the height of the resultant cell layout, a cell created using an interleaved method typically offers slower performance than a cell in which the transistors are noninterleaved. This is because the connections between gates of low strength complementary pairs that are supplemental of each other, e.g. gates of transistor pairs 400/450 and transistor pairs 406/456, are made in polysilicon, e.g. polysilicon wire 708 of FIG. 11, instead of in metal, e.g. metal one conductor 500 of FIG. 10. Since polysilicon is not as conductive as metal, performance suffers. Further, in contrast to the interleaved layout, sources and drains of noninterleaved transistors are typically coupled together in shared regions, which offer greater speed and lower power consumption.

The ability to specify beforehand, i.e. prior to run time, whether the transistors of a resultant cell are interleaved or noninterleaved allows an IC designer to make tradeoff decisions between cell size and cell performance in a design rules independent manner. For example, an IC designer may desire a library of fast cells and may therefore specify, in the criteria for interleaving 260 before the execution of a program implementing the inventive method, that transistors in the cells that are created for a specific library should all be interleaved. Thereafter, regardless of changes in the design rules, cells created in accordance with such a criteria for interleaving 260 are always interleaved. Conversely, if it is desired to have cells that have a minimal height, an IC designer may specify beforehand, in the criteria for interleaving 260, that transistors in the cells that are created for a specific library should all be noninterleaved. To further reduce cell height, the IC designer may also specify that well ties should always be placed to the side of the CMOS dual structure in the manner discussed earlier.

Although the foregoing invention has been described in some detail for purposes of clarity of understanding, it will be apparent that certain changes and modifications may be practiced within the scope of the appended claims. For instance, although the specification has described in detail an interleaved and noninterleaved NAND-2 gate, gates having a greater or few number of input terms may be created using the inventive method. As another example, although the specific embodiment creates metal one input terminals prior to creating metal one output terminals, these steps may be reversed without departing from the scope and spirit of the present invention. Further, although a NAND-2 cell is used herein for purpose of illustration, other parameterizable cells such as NOR, OR, NOT, and the like, may be generated using the inventive method disclosed herein. Although the specific embodiment discusses, for purpose of illustration, a NAND-2 cell comprising two low strength NAND-2 gates coupled in parallel, it is within the ability of one skilled in the art to couple together a greater or fewer number of low strength gates to derive cells of different drive strengths. Consequently, the scope of the invention is not limited to the specific examples given herein but is set forth in the appended claims.

What is claimed is:

1. A method for creating a cell layout representative of a CMOS logic cell in a digital computer, comprising:

creating a first half dual structure in a first memory of said digital computer, said first half dual structure comprising a first transistor group and a second transistor group, said second transistor group being substantially identical to said first transistor group, transistors in said first transistor group and said second transistor group being of a first type and oriented along a first direction;

creating a second half dual structure in a second memory of said digital computer, said second half dual structure comprising a third transistor group and a fourth transistor group, said fourth transistor group being substantially identical to said third transistor group, transistors in said third transistor group and said fourth transistor group being of a second type complementary to said first type and oriented along said first direction;

coupling, using a processor in said digital computer, a polysilicon conductor to an input of a first complementary transistor group, said first complementary transistor group comprising a selected transistor in said first transistor group and a selected transistor in said third transistor group, said input of said first complementary transistor group being coupled to gates of said selected transistor in said first transistor group and said selected transistor in said third transistor group;

coupling, using said processor in said digital computer, a polysilicon conductor to an input of a second complementary transistor group, said second complementary transistor group comprising a selected transistor in said second transistor group and a selected transistor in said fourth transistor group, said input of said second complementary transistor group being coupled to gates of said selected transistor in said second transistor group and said selected transistor in said fourth transistor group;

coupling, using said processor in said digital computer, a first metal one conductor to said first polysilicon conductor and said second polysilicon conductor, thereby creating a logic gate; and dynamically placing, responsive to an input parameter, a set of well ties at one of a first location and a second location, said first location being disposed directly above a well of said CMOS logic cell, said well being aligned with both said first half dual structure and said second half dual structure along said first direction, said second location being disposed beside one of said first and second half dual structures, wherein said set of well ties being placed at said first location if a height of said CMOS logic cell does not exceed a predefined maximum cell height, said set of well ties being placed at said second location if said height of said CMOS logic cell exceeds said predefined maximum cell height.

2. The method of claim 1 wherein said input parameter represents a user input.

3. The method of claim 1 wherein said input parameter represents an inputted set of predefined conditions.

4. The method of claim 3 wherein said inputted set of predefined conditions comprises said predefined maximum cell height, whereby said dynamic placing allows a final position of said set of well ties to be determined in a design-rule independent manner.

5. A computer-implemented apparatus for generating a cell layout representative of a CMOS logic cell, comprising:

a pMOS transistor layout generator, said pMOS transistor layout generator generates a first set of layout data representative of a plurality of substantially similar pMOS relatively low strength transistor groups, transistors in said plurality of substantially similar pMOS relatively low strength transistor groups being oriented along a first direction;

an nMOS transistor layout generator, said nMOS transistor layout generator generates a second set of layout data representative of a plurality of substantially similar nMOS relatively low strength transistor groups, transistors in said plurality of nMOS relatively low strength transistor groups being oriented along said first direction;

a polysilicon conductor generator, said polysilicon conductor generator generates a third set of layout data representative of a plurality of polysilicon conductors for coupling transistors in said plurality of substantially similar pMOS relatively low strength transistor groups with complementary ones of transistors in said plurality of substantially similar nMOS relatively low strength transistor groups, thereby creating a plurality of low strength gates;

a metal one conductor generator, said metal one conductor generator generates a fourth set of layout data representative of a first metal one conductor, said first metal one conductor being coupled to said plurality of polysilicon conductors to create a relatively higher strength gate out of said plurality of low strength gates; and a well ties generator for generating a fifth set of layout data representative of a set of well ties, said set of well ties being positioned, responsive to a user input, at one of a first location and a second location, said first location being disposed directly above a well of said CMOS logic cell and aligned with both said first half dual structure and said second half dual structure along said first direction, said second location being disposed beside one of said plurality of substantially similar pMOS relatively low strength transistor groups and said plurality of substantially similar nMOS relatively low strength transistor groups.

6. The apparatus of claim 5 wherein said input parameter represents a user input.

7. The apparatus of claim 5 wherein said input parameter represents an inputted set of predefined conditions.

8. The apparatus of claim 7 wherein said inputted set of predefined conditions comprises a predefined maximum cell height, wherein said well ties generator is configured to place said set of well ties at said first location if a height of said CMOS logic cell does not exceed said predefined maximum cell height, said well ties generator is configured to place said set of well ties at said second location if said height of said CMOS logic cell exceeds said predefined maximum cell height, thereby rendering a final position of said set of well ties in said CMOS logic cell design-rule independent.

9. A computer-implemented apparatus for generating a cell layout representative of a CMOS logic cell, comprising:

a pMOS transistor layout generator, said pMOS transistor layout generator generates a first set of layout data representative of a plurality of substantially similar pMOS relatively low strength transistor groups, transistors in said plurality of substantially similar pMOS relatively low strength transistor groups being oriented along a first direction;

an nMOS transistor layout generator, said nMOS transistor layout generator generates a second set of layout data representative of a plurality of substantially similar nMOS relatively low strength transistor groups, transistors in said plurality of nMOS relatively low strength transistor groups being oriented along said first direction;

a polysilicon conductor generator, said polysilicon conductor generator generates a third set of layout data representative of a plurality of polysilicon conductors for coupling transistors in said plurality of substantially similar pMOS relatively low strength transistor groups with complementary ones of transistors in said plurality of substantially similar nMOS relatively low strength transistor groups, thereby creating a plurality of low strength gates;

a metal one conductor generator, said metal one conductor generator generates a fourth set of layout data representative of a first metal one conductor, said first metal one conductor being coupled to said plurality of polysilicon conductors to create a relatively higher strength gate out of said plurality of low strength gates; and a well ties generator for dynamically generating a fifth set of layout data representative of a set of well ties, said set of well ties being positioned dynamically, responsive to an inputted set of predefined conditions, at one of a first location and a second location, said first location being disposed directly above a well of said CMOS logic cell and aligned with both said first half dual structure and said second half dual structure alone said first direction, said second location being disposed beside one of said plurality of substantially similar pMOS relatively low strength transistor groups and said plurality of substantially similar nMOS relatively low strength transistor groups.

10. The apparatus of claim 9 wherein said inputted set of predefined conditions comprises a predefined maximum cell height, said set of well ties being dynamically placed at said first location if a height of said CMOS logic cell does not exceed said predefined maximum cell height, said set of well ties being dynamically placed at said second location if said height of said CMOS logic cell exceeds said predefined maximum cell height, whereby said dynamic positioning allows a final position of said set of well ties to be dynamically determined in a design-rule independent manner.

11. A computer readable media containing program instructions for creating a cell layout representative of a CMOS logic cell in a digital computer, comprising:

a first set of program instructions for creating a first half dual structure in a first memory of said digital computer, said first half dual structure comprising a first transistor group and a second transistor group, said second transistor group being substantially identical to said first transistor group, transistors in said first transistor group and said second transistor group being of a first type and oriented along a first direction;

a second set of program instructions for creating a second half dual structure in a second memory of said digital computer, said second half dual structure comprising a third transistor group and a fourth transistor group, said fourth transistor group being substantially identical to said third transistor group, transistors in said third transistor group and said fourth transistor group being of a second type complementary to said first type and oriented along said first direction;

a third set of program instructions for coupling, using a processor in said digital computer, a polysilicon conductor to an input of a first complementary transistor group, said first complementary transistor group comprising a selected transistor in said first transistor group and a selected transistor in said third transistor group, said input of said first complementary transistor group being coupled to gates of said selected transistor in said first transistor group and said selected transistor in said third transistor group;

a fourth set of program instructions for coupling, using said processor in said digital computer, a polysilicon conductor to an input of a second complementary transistor group, said second complementary transistor group comprising a selected transistor in said second transistor group and a selected transistor in said fourth transistor group, said input of said second complementary transistor group being coupled to gates of said selected transistor in said second transistor group and said selected transistor in said fourth transistor group;

a fifth set of program instructions for coupling, using said processor in said digital computer, a first metal one conductor to said first polysilicon conductor and said second polysilicon conductor, thereby creating a logic gate; and a sixth set of program instructions for dynamically placing, responsive to an input parameter, a set of well ties at one of a first location and a second location, said first location being disposed directly above a well of said CMOS logic cell and aligned with both said first half dual structure and said second half dual structure alone said first direction, said second location being disposed beside one of said first and second half dual structures.

12. The computer readable media of claim 11 wherein said input parameter represents a user input.

13. The computer readable media of claim 11 wherein said input parameter represents a user inputted set of predefined conditions.

14. The computer readable media of claim 13 wherein said inputted set of predefined conditions comprises a predefined maximum cell height, said set of well ties being placed at said first location if a height of said cell layout is determined, while executing said program instructions, not to exceed said predefined maximum cell height, said set of well ties being placed at said second location if said height of said cell layout is determined, while executing said program instructions, to exceed said predefined maximum cell height, whereby said dynamic placing allows a final position of said set of well ties to be determined in a design-rule independent manner.

* * * * *

UNITED STATES PATENT AND TRADEMARK OFFICE
CERTIFICATE OF CORRECTION

PATENT NO. : 5,764,533
DATED : June 9, 1998
INVENTOR(S) : Paul C. deDood

It is certified that error appears in the above-identified patent and that said Letters Patent is hereby corrected as shown below:

Column 26, line 30, change "alone" to --along--.

Signed and Sealed this

Twenty-ninth Day of December, 1998

Attest:

BRUCE LEHMAN

Attesting Officer     Commissioner of Patents and Trademarks